(12) United States Patent
Simon et al.

(10) Patent No.: US 9,057,493 B2
(45) Date of Patent: Jun. 16, 2015

(54) LED LIGHT TUBE WITH DUAL SIDED LIGHT DISTRIBUTION

(75) Inventors: David L. Simon, Grosse Pointe Woods, MI (US); John Ivey, Farmington Hills, MI (US)

(73) Assignee: iLumisys, Inc., Troy, MI (US)

( * ) Notice: Subject to any disclaimer, the term of this patent is extended or adjusted under 35 U.S.C. 154(b) by 395 days.

(21) Appl. No.: 13/071,576

(22) Filed: Mar. 25, 2011

(65) Prior Publication Data

US 2011/0235318 A1    Sep. 29, 2011

Related U.S. Application Data

(60) Provisional application No. 61/317,825, filed on Mar. 26, 2010.

(51) Int. Cl.
| F21V 7/00 | (2006.01) |
| F21S 4/00 | (2006.01) |
| F21V 1/00 | (2006.01) |

(Continued)

(52) U.S. Cl.
CPC . *F21S 4/008* (2013.01); *F21K 9/17* (2013.01); *F21V 7/0008* (2013.01); *F21V 7/0016* (2013.01); *F21V 7/0025* (2013.01); *F21V 7/005* (2013.01); *F21Y 2101/02* (2013.01); *F21Y 2103/003* (2013.01); *F21Y 2105/001* (2013.01); *H05K 1/02* (2013.01);
(Continued)

(58) Field of Classification Search
CPC .................................................. F21Y 2103/003
USPC ........ 362/225, 293, 217.08–217.09, 298–303
See application file for complete search history.

(56) References Cited

U.S. PATENT DOCUMENTS

| 54,511 A | 2/1920 | Owen |
| 58,105 A | 6/1921 | Poritz |

(Continued)

FOREIGN PATENT DOCUMENTS

| CN | 1584388 A | 2/2005 |
| CN | 2766345 Y | 3/2006 |

(Continued)

OTHER PUBLICATIONS

Wolsey, Robert. Interoperable Systems: The Future of Lighting Control, Lighting Research Center, Jan. 1, 1997, vol. 2 No. 2, Rensselaer Polytechnic Institute, Troy, New York [online]. Retrieved Lighting Research Center Web Page using Internet <URL: http://www.lrc.rpi.edu/programs/Futures/LF-BAS/index.asp>.

(Continued)

*Primary Examiner* — Hargobind S Sawhney
*Assistant Examiner* — Bryon T Gyllstrom
(74) *Attorney, Agent, or Firm* — Young Basile

(57) ABSTRACT

Disclosed herein are embodiments of LED-based lights for use in fluorescent fixtures that emanate light in a plurality of directions. One embodiment disclosed herein of an LED light for use in a fluorescent light fixture comprises a housing and a circuit board having a first surface configured to face an illumination area, the circuit board mounted in the housing and defining a plane conceptually dividing the housing into a first portion and a second portion. At least one LED is mounted on the first surface of the circuit board and is configured to emanate light in a first direction. Light distribution means is configured to distribute a portion of the light emanated in the first direction to at least a second direction different than the first direction.

21 Claims, 3 Drawing Sheets

(51) Int. Cl.
  *F21V 5/00* (2006.01)
  *F21K 99/00* (2010.01)
  *F21Y 101/02* (2006.01)
  *F21Y 103/00* (2006.01)
  *F21Y 105/00* (2006.01)
  *H05K 1/02* (2006.01)

(52) U.S. Cl.
  CPC ............... *H05K 2201/09063* (2013.01); *H05K 2201/10106* (2013.01); *F21V 29/83* (2013.01)

(56) References Cited

U.S. PATENT DOCUMENTS

| | | |
|---|---|---|
| 79,814 A | 8/1929 | Hoch |
| 80,419 A | 1/1930 | Kramer |
| 84,763 A | 7/1931 | Stange |
| D119,797 S | 4/1940 | Winkler et al. |
| D125,312 S | 2/1941 | Logan |
| 2,909,097 A | 10/1959 | Alden et al. |
| 3,318,185 A | 5/1967 | Kott |
| 3,561,719 A | 2/1971 | Grindle |
| 3,586,936 A | 6/1971 | McLeroy |
| 3,601,621 A | 8/1971 | Ritchie |
| 3,612,855 A | 10/1971 | Juhnke |
| 3,643,088 A | 2/1972 | Osteen et al. |
| 3,746,918 A | 7/1973 | Drucker et al. |
| 3,818,216 A | 6/1974 | Larraburu |
| 3,832,503 A | 8/1974 | Crane |
| 3,858,086 A | 12/1974 | Anderson et al. |
| 3,909,670 A | 9/1975 | Wakamatsu et al. |
| 3,924,120 A | 12/1975 | Cox, III |
| 3,958,885 A | 5/1976 | Stockinger et al. |
| 3,974,637 A | 8/1976 | Bergey et al. |
| 3,993,386 A | 11/1976 | Rowe |
| 4,001,571 A | 1/1977 | Martin |
| 4,054,814 A | 10/1977 | Fegley et al. |
| 4,070,568 A | 1/1978 | Gala |
| 4,082,395 A | 4/1978 | Donato et al. |
| 4,096,349 A | 6/1978 | Donato |
| 4,102,558 A | 7/1978 | Krachman |
| 4,107,581 A | 8/1978 | Abernethy |
| 4,189,663 A | 2/1980 | Schmutzer et al. |
| 4,211,955 A | 7/1980 | Ray |
| 4,241,295 A | 12/1980 | Williams, Jr. |
| 4,271,408 A | 6/1981 | Teshima et al. |
| 4,272,689 A | 6/1981 | Crosby et al. |
| 4,273,999 A | 6/1981 | Pierpoint |
| 4,298,869 A | 11/1981 | Okuno |
| 4,329,625 A | 5/1982 | Nishizawa et al. |
| 4,339,788 A | 7/1982 | White et al. |
| 4,342,947 A | 8/1982 | Bloyd |
| 4,367,464 A | 1/1983 | Kurahashi et al. |
| D268,134 S | 3/1983 | Zurcher |
| 4,382,272 A | 5/1983 | Quella et al. |
| 4,388,567 A | 6/1983 | Yamazaki et al. |
| 4,388,589 A | 6/1983 | Molldrem, Jr. |
| 4,392,187 A | 7/1983 | Bornhorst |
| 4,394,719 A | 7/1983 | Moberg |
| 4,420,711 A | 12/1983 | Takahashi et al. |
| 4,455,562 A | 6/1984 | Dolan et al. |
| 4,500,796 A | 2/1985 | Quin |
| 4,521,835 A | 6/1985 | Meggs et al. |
| 4,581,687 A | 4/1986 | Nakanishi |
| 4,597,033 A | 6/1986 | Meggs et al. |
| 4,600,972 A | 7/1986 | MacIntyre |
| 4,607,317 A | 8/1986 | Lin |
| 4,622,881 A | 11/1986 | Rand |
| 4,625,152 A | 11/1986 | Nakai |
| 4,635,052 A | 1/1987 | Aoike et al. |
| 4,647,217 A | 3/1987 | Havel |
| 4,656,398 A | 4/1987 | Michael et al. |
| 4,661,890 A | 4/1987 | Watanabe et al. |
| 4,668,895 A | 5/1987 | Schneiter |
| 4,675,575 A | 6/1987 | Smith et al. |
| 4,682,079 A | 7/1987 | Sanders et al. |
| 4,686,425 A | 8/1987 | Havel |
| 4,687,340 A | 8/1987 | Havel |
| 4,688,154 A | 8/1987 | Nilssen |
| 4,688,869 A | 8/1987 | Kelly |
| 4,695,769 A | 9/1987 | Schweickardt |
| 4,698,730 A | 10/1987 | Sakai et al. |
| 4,701,669 A | 10/1987 | Head et al. |
| 4,705,406 A | 11/1987 | Havel |
| 4,707,141 A | 11/1987 | Havel |
| D293,723 S | 1/1988 | Buttner |
| 4,727,289 A | 2/1988 | Uchida |
| 4,740,882 A | 4/1988 | Miller |
| 4,748,545 A | 5/1988 | Schmitt |
| 4,753,148 A | 6/1988 | Johnson |
| 4,758,173 A | 7/1988 | Northrop |
| 4,771,274 A | 9/1988 | Havel |
| 4,780,621 A | 10/1988 | Bartleucci et al. |
| 4,794,383 A | 12/1988 | Havel |
| 4,810,937 A | 3/1989 | Havel |
| 4,818,072 A | 4/1989 | Mohebban |
| 4,824,269 A | 4/1989 | Havel |
| 4,837,565 A | 6/1989 | White |
| 4,843,627 A | 6/1989 | Stebbins |
| 4,845,481 A | 7/1989 | Havel |
| 4,845,745 A | 7/1989 | Havel |
| 4,857,801 A | 8/1989 | Farrell |
| 4,863,223 A | 9/1989 | Weissenbach et al. |
| 4,870,325 A | 9/1989 | Kazar |
| 4,874,320 A | 10/1989 | Freed et al. |
| 4,887,074 A | 12/1989 | Simon et al. |
| 4,894,832 A | 1/1990 | Colak |
| 4,901,207 A | 2/1990 | Sato et al. |
| 4,912,371 A | 3/1990 | Hamilton |
| 4,922,154 A | 5/1990 | Cacoub |
| 4,929,936 A | 5/1990 | Friedman et al. |
| 4,934,852 A | 6/1990 | Havel |
| 4,941,072 A | 7/1990 | Yasumoto et al. |
| 4,943,900 A | 7/1990 | Gartner |
| 4,962,687 A | 10/1990 | Belliveau et al. |
| 4,965,561 A | 10/1990 | Havel |
| 4,973,835 A | 11/1990 | Kurosu et al. |
| 4,977,351 A | 12/1990 | Bavaro et al. |
| 4,979,081 A | 12/1990 | Leach et al. |
| 4,980,806 A | 12/1990 | Taylor et al. |
| 4,991,070 A * | 2/1991 | Stob ........................... 362/223 |
| 4,992,704 A | 2/1991 | Stinson |
| 5,003,227 A | 3/1991 | Nilssen |
| 5,008,595 A | 4/1991 | Kazar |
| 5,008,788 A | 4/1991 | Palinkas |
| 5,010,459 A | 4/1991 | Taylor et al. |
| 5,018,054 A | 5/1991 | Ohashi et al. |
| 5,027,037 A | 6/1991 | Wei |
| 5,027,262 A | 6/1991 | Freed |
| 5,032,960 A | 7/1991 | Katoh |
| 5,034,807 A | 7/1991 | Von Kohorn |
| 5,036,248 A | 7/1991 | McEwan et al. |
| 5,038,255 A | 8/1991 | Nishihashi et al. |
| 5,065,226 A | 11/1991 | Kluitmans et al. |
| 5,072,216 A | 12/1991 | Grange |
| 5,078,039 A | 1/1992 | Tulk et al. |
| 5,083,063 A | 1/1992 | Brooks |
| 5,088,013 A | 2/1992 | Revis |
| 5,089,748 A | 2/1992 | Ihms |
| 5,103,382 A | 4/1992 | Kondo et al. |
| 5,122,733 A | 6/1992 | Havel |
| 5,126,634 A | 6/1992 | Johnson |
| 5,128,595 A | 7/1992 | Hara |
| 5,130,909 A | 7/1992 | Gross |
| 5,134,387 A | 7/1992 | Smith et al. |
| 5,140,220 A | 8/1992 | Hasegawa |
| 5,142,199 A | 8/1992 | Elwell |
| 5,151,679 A | 9/1992 | Dimmick |
| 5,154,641 A | 10/1992 | McLaughlin |
| 5,161,879 A | 11/1992 | McDermott |
| 5,161,882 A | 11/1992 | Garrett |
| 5,164,715 A | 11/1992 | Kashiwabara et al. |
| 5,184,114 A | 2/1993 | Brown |
| 5,194,854 A | 3/1993 | Havel |
| 5,198,756 A | 3/1993 | Jenkins et al. |

(56) References Cited

U.S. PATENT DOCUMENTS

| | | | |
|---|---|---|---|
| 5,209,560 A | 5/1993 | Taylor et al. | |
| 5,220,250 A | 6/1993 | Szuba | |
| 5,225,765 A | 7/1993 | Callahan et al. | |
| 5,226,723 A | 7/1993 | Chen | |
| 5,254,910 A | 10/1993 | Yang | |
| 5,256,948 A | 10/1993 | Boldin et al. | |
| 5,278,542 A | 1/1994 | Smith et al. | |
| 5,282,121 A | 1/1994 | Bornhorst et al. | |
| 5,283,517 A | 2/1994 | Havel | |
| 5,287,352 A | 2/1994 | Jackson et al. | |
| 5,294,865 A | 3/1994 | Haraden | |
| 5,298,871 A | 3/1994 | Shimohara | |
| 5,301,090 A | 4/1994 | Hed | |
| 5,303,124 A | 4/1994 | Wrobel | |
| 5,307,295 A | 4/1994 | Taylor et al. | |
| 5,321,593 A | 6/1994 | Moates | |
| 5,323,226 A | 6/1994 | Schreder | |
| 5,329,431 A | 7/1994 | Taylor et al. | |
| 5,344,068 A | 9/1994 | Haessig | |
| 5,350,977 A | 9/1994 | Hamamoto et al. | |
| 5,357,170 A | 10/1994 | Luchaco et al. | |
| 5,371,618 A | 12/1994 | Tai et al. | |
| 5,374,876 A | 12/1994 | Horibata et al. | |
| 5,375,043 A | 12/1994 | Tokunaga | |
| D354,360 S * | 1/1995 | Murata | D26/3 |
| 5,381,074 A | 1/1995 | Rudzewicz et al. | |
| 5,388,357 A | 2/1995 | Malita | |
| 5,402,702 A | 4/1995 | Hata | |
| 5,404,282 A | 4/1995 | Klinke et al. | |
| 5,406,176 A | 4/1995 | Sugden | |
| 5,410,328 A | 4/1995 | Yoksza et al. | |
| 5,412,284 A | 5/1995 | Moore et al. | |
| 5,412,552 A | 5/1995 | Fernandes | |
| 5,420,482 A | 5/1995 | Phares | |
| 5,421,059 A | 6/1995 | Leffers, Jr. | |
| 5,430,356 A | 7/1995 | Ference et al. | |
| 5,432,408 A | 7/1995 | Matsuda et al. | |
| 5,436,535 A | 7/1995 | Yang | |
| 5,436,853 A | 7/1995 | Shimohara | |
| 5,450,301 A | 9/1995 | Waltz et al. | |
| 5,461,188 A | 10/1995 | Drago et al. | |
| 5,463,280 A | 10/1995 | Johnson | |
| 5,463,502 A | 10/1995 | Savage, Jr. | |
| 5,465,144 A | 11/1995 | Parker et al. | |
| 5,475,300 A | 12/1995 | Havel | |
| 5,489,827 A | 2/1996 | Xia | |
| 5,491,402 A | 2/1996 | Small | |
| 5,493,183 A | 2/1996 | Kimball | |
| 5,504,395 A | 4/1996 | Johnson et al. | |
| 5,506,760 A | 4/1996 | Giebler et al. | |
| 5,513,082 A | 4/1996 | Asano | |
| 5,519,496 A | 5/1996 | Borgert et al. | |
| 5,519,596 A * | 5/1996 | Woolverton | 362/249.01 |
| 5,530,322 A | 6/1996 | Ference et al. | |
| 5,544,809 A | 8/1996 | Keating et al. | |
| 5,545,950 A | 8/1996 | Cho | |
| 5,550,440 A | 8/1996 | Allison et al. | |
| 5,559,681 A | 9/1996 | Duarte | |
| 5,561,346 A | 10/1996 | Byrne | |
| D376,030 S | 11/1996 | Cohen | |
| 5,575,459 A | 11/1996 | Anderson | |
| 5,575,554 A | 11/1996 | Guritz | |
| 5,581,158 A | 12/1996 | Quazi | |
| 5,592,051 A | 1/1997 | Korkala | |
| 5,592,054 A | 1/1997 | Nerone et al. | |
| 5,600,199 A | 2/1997 | Martin, Sr. et al. | |
| 5,607,227 A | 3/1997 | Yasumoto et al. | |
| 5,608,290 A | 3/1997 | Hutchisson et al. | |
| 5,614,788 A | 3/1997 | Mullins et al. | |
| 5,621,282 A | 4/1997 | Haskell | |
| 5,621,603 A | 4/1997 | Adamec et al. | |
| 5,621,662 A | 4/1997 | Humphries et al. | |
| 5,622,423 A | 4/1997 | Lee | |
| 5,633,629 A | 5/1997 | Hochstein | |
| 5,634,711 A | 6/1997 | Kennedy et al. | |
| 5,640,061 A | 6/1997 | Bornhorst et al. | |
| 5,640,141 A | 6/1997 | Myllymaki | |
| 5,642,129 A | 6/1997 | Zavracky et al. | |
| 5,655,830 A | 8/1997 | Ruskouski | |
| 5,656,935 A | 8/1997 | Havel | |
| 5,661,374 A | 8/1997 | Cassidy et al. | |
| 5,661,645 A | 8/1997 | Hochstein | |
| 5,673,059 A | 9/1997 | Zavracky et al. | |
| 5,682,103 A | 10/1997 | Burrell | |
| 5,688,042 A | 11/1997 | Madadi et al. | |
| 5,697,695 A | 12/1997 | Lin et al. | |
| 5,701,058 A | 12/1997 | Roth | |
| 5,712,650 A | 1/1998 | Barlow | |
| 5,721,471 A | 2/1998 | Begemann et al. | |
| 5,725,148 A | 3/1998 | Hartman | |
| 5,726,535 A | 3/1998 | Yan | |
| 5,731,759 A | 3/1998 | Finucan | |
| 5,734,590 A | 3/1998 | Tebbe | |
| 5,751,118 A | 5/1998 | Mortimer | |
| 5,752,766 A | 5/1998 | Bailey et al. | |
| 5,765,940 A | 6/1998 | Levy et al. | |
| 5,769,527 A | 6/1998 | Taylor et al. | |
| 5,784,006 A | 7/1998 | Hochstein | |
| 5,785,227 A | 7/1998 | Akiba | |
| 5,790,329 A | 8/1998 | Klaus et al. | |
| 5,803,579 A | 9/1998 | Turnbull et al. | |
| 5,803,580 A | 9/1998 | Tseng | |
| 5,803,729 A | 9/1998 | Tsimerman | |
| 5,806,965 A | 9/1998 | Deese | |
| 5,808,689 A | 9/1998 | Small | |
| 5,810,463 A | 9/1998 | Kawahara et al. | |
| 5,812,105 A | 9/1998 | Van de Ven | |
| 5,813,751 A | 9/1998 | Shaffer | |
| 5,813,753 A | 9/1998 | Vriens et al. | |
| 5,821,695 A | 10/1998 | Vilanilam et al. | |
| 5,825,051 A | 10/1998 | Bauer et al. | |
| 5,828,178 A | 10/1998 | York et al. | |
| 5,836,676 A | 11/1998 | Ando et al. | |
| 5,848,837 A | 12/1998 | Gustafson | |
| 5,850,126 A | 12/1998 | Kanbar | |
| 5,851,063 A | 12/1998 | Doughty et al. | |
| 5,852,658 A | 12/1998 | Knight et al. | |
| 5,854,542 A | 12/1998 | Forbes | |
| RE36,030 E | 1/1999 | Nadeau | |
| 5,859,508 A | 1/1999 | Ge et al. | |
| 5,865,529 A | 2/1999 | Yan | |
| 5,890,794 A | 4/1999 | Abtahi et al. | |
| 5,896,010 A | 4/1999 | Mikolajczak et al. | |
| 5,907,742 A | 5/1999 | Johnson et al. | |
| 5,912,653 A | 6/1999 | Fitch | |
| 5,921,660 A | 7/1999 | Yu | |
| 5,924,784 A | 7/1999 | Chliwnyj et al. | |
| 5,927,845 A | 7/1999 | Gustafson et al. | |
| 5,934,792 A | 8/1999 | Camarota | |
| 5,943,802 A | 8/1999 | Tijanic | |
| 5,946,209 A | 8/1999 | Eckel et al. | |
| 5,949,347 A | 9/1999 | Wu | |
| 5,952,680 A | 9/1999 | Strite | |
| 5,959,547 A | 9/1999 | Tubel et al. | |
| 5,962,989 A | 10/1999 | Baker | |
| 5,962,992 A | 10/1999 | Huang et al. | |
| 5,963,185 A | 10/1999 | Havel | |
| 5,974,553 A | 10/1999 | Gandar | |
| 5,980,064 A | 11/1999 | Metroyanis | |
| 5,998,925 A | 12/1999 | Shimizu et al. | |
| 5,998,928 A | 12/1999 | Hipp | |
| 6,007,209 A | 12/1999 | Pelka | |
| 6,008,783 A | 12/1999 | Kitagawa et al. | |
| 6,011,691 A | 1/2000 | Schreffler | |
| 6,016,038 A | 1/2000 | Mueller et al. | |
| 6,018,237 A | 1/2000 | Havel | |
| 6,019,493 A | 2/2000 | Kuo et al. | |
| 6,020,825 A | 2/2000 | Chansky et al. | |
| 6,025,550 A | 2/2000 | Kato | |
| 6,028,694 A | 2/2000 | Schmidt | |
| 6,030,099 A | 2/2000 | McDermott | |
| 6,031,343 A | 2/2000 | Recknagel et al. | |
| D422,737 S | 4/2000 | Orozco | |
| 6,056,420 A | 5/2000 | Wilson et al. | |

(56) References Cited

U.S. PATENT DOCUMENTS

| | | | |
|---|---|---|---|
| 6,068,383 A | 5/2000 | Robertson et al. |
| 6,069,597 A | 5/2000 | Hansen |
| 6,072,280 A | 6/2000 | Allen |
| 6,084,359 A | 7/2000 | Hetzel et al. |
| 6,086,220 A | 7/2000 | Lash et al. |
| 6,091,200 A | 7/2000 | Lenz |
| 6,092,915 A | 7/2000 | Rensch |
| 6,095,661 A | 8/2000 | Lebens et al. |
| 6,097,352 A | 8/2000 | Zavracky et al. |
| 6,116,748 A | 9/2000 | George |
| 6,121,875 A | 9/2000 | Hamm et al. |
| 6,127,783 A | 10/2000 | Pashley et al. |
| 6,132,072 A | 10/2000 | Turnbull et al. |
| 6,135,604 A | 10/2000 | Lin |
| 6,139,174 A | 10/2000 | Butterworth |
| 6,149,283 A | 11/2000 | Conway et al. |
| 6,150,774 A | 11/2000 | Mueller et al. |
| 6,151,529 A | 11/2000 | Batko |
| 6,153,985 A | 11/2000 | Grossman |
| 6,158,882 A | 12/2000 | Bischoff, Jr. |
| 6,166,496 A | 12/2000 | Lys et al. |
| 6,175,201 B1 | 1/2001 | Sid |
| 6,175,220 B1 | 1/2001 | Billig et al. |
| 6,181,126 B1 | 1/2001 | Havel |
| 6,183,086 B1 | 2/2001 | Neubert |
| 6,183,104 B1 | 2/2001 | Ferrara |
| 6,184,628 B1 | 2/2001 | Ruthenberg |
| 6,196,471 B1 | 3/2001 | Ruthenberg |
| 6,203,180 B1 | 3/2001 | Fleischmann |
| 6,211,626 B1 | 4/2001 | Lys et al. |
| 6,215,409 B1 | 4/2001 | Blach |
| 6,217,190 B1 | 4/2001 | Altman et al. |
| 6,219,239 B1 | 4/2001 | Mellberg et al. |
| 6,227,679 B1 | 5/2001 | Zhang et al. |
| 6,238,075 B1 | 5/2001 | Dealey, Jr. et al. |
| 6,241,359 B1 | 6/2001 | Lin |
| 6,250,774 B1 | 6/2001 | Begemann et al. |
| 6,252,350 B1 | 6/2001 | Alvarez |
| 6,252,358 B1 | 6/2001 | Xydis et al. |
| 6,268,600 B1 | 7/2001 | Nakamura et al. |
| 6,273,338 B1 | 8/2001 | White |
| 6,275,397 B1 | 8/2001 | McClain |
| 6,283,612 B1 * | 9/2001 | Hunter ............ 362/240 |
| 6,292,901 B1 | 9/2001 | Lys et al. |
| 6,293,684 B1 | 9/2001 | Riblett |
| 6,297,724 B1 | 10/2001 | Bryans et al. |
| 6,305,109 B1 | 10/2001 | Lee |
| 6,305,821 B1 | 10/2001 | Hsieh et al. |
| 6,307,331 B1 | 10/2001 | Bonasia et al. |
| 6,310,590 B1 | 10/2001 | Havel |
| 6,323,832 B1 | 11/2001 | Nishizawa et al. |
| 6,325,651 B1 | 12/2001 | Nishihara et al. |
| 6,334,699 B1 | 1/2002 | Gladnick |
| 6,340,868 B1 | 1/2002 | Lys et al. |
| 6,354,714 B1 | 3/2002 | Rhodes |
| 6,361,186 B1 | 3/2002 | Slayden |
| 6,369,525 B1 | 4/2002 | Chang et al. |
| 6,371,637 B1 | 4/2002 | Atchinson et al. |
| 6,379,022 B1 | 4/2002 | Amerson et al. |
| D457,667 S | 5/2002 | Piepgras et al. |
| D457,669 S | 5/2002 | Piepgras et al. |
| D457,974 S | 5/2002 | Piepgras et al. |
| 6,388,393 B1 | 5/2002 | Illingworth |
| 6,394,623 B1 | 5/2002 | Tsui |
| D458,395 S | 6/2002 | Piepgras et al. |
| 6,400,096 B1 | 6/2002 | Wells et al. |
| 6,404,131 B1 | 6/2002 | Kawano et al. |
| 6,411,022 B1 | 6/2002 | Machida |
| 6,422,716 B2 | 7/2002 | Henrici et al. |
| 6,428,189 B1 | 8/2002 | Hochstein |
| D463,610 S | 9/2002 | Piepgras et al. |
| 6,445,139 B1 | 9/2002 | Marshall et al. |
| 6,448,550 B1 | 9/2002 | Nishimura |
| 6,448,716 B1 | 9/2002 | Hutchison |
| 6,459,919 B1 | 10/2002 | Lys et al. |
| 6,469,457 B2 | 10/2002 | Callahan |
| 6,471,388 B1 | 10/2002 | Marsh |
| 6,472,823 B2 | 10/2002 | Yen |
| 6,473,002 B1 | 10/2002 | Hutchison |
| D468,035 S | 12/2002 | Blanc et al. |
| 6,488,392 B1 | 12/2002 | Lu |
| 6,495,964 B1 | 12/2002 | Muthu et al. |
| 6,527,411 B1 | 3/2003 | Sayers |
| 6,528,954 B1 | 3/2003 | Lys et al. |
| 6,528,958 B2 | 3/2003 | Hulshof et al. |
| 6,538,375 B1 | 3/2003 | Duggal et al. |
| 6,548,967 B1 | 4/2003 | Dowling et al. |
| 6,568,834 B1 | 5/2003 | Scianna |
| 6,573,536 B1 | 6/2003 | Dry |
| 6,577,072 B2 | 6/2003 | Saito et al. |
| 6,577,080 B2 | 6/2003 | Lys et al. |
| 6,577,512 B2 | 6/2003 | Tripathi et al. |
| 6,577,794 B1 | 6/2003 | Currie et al. |
| 6,578,979 B2 | 6/2003 | Truttmann-Battig |
| 6,582,103 B1 | 6/2003 | Popovich et al. |
| 6,583,550 B2 * | 6/2003 | Iwasa et al. ............ 313/485 |
| 6,583,573 B2 | 6/2003 | Bierman |
| 6,585,393 B1 | 7/2003 | Brandes et al. |
| 6,586,890 B2 | 7/2003 | Min et al. |
| 6,590,343 B2 | 7/2003 | Pederson |
| 6,592,238 B2 | 7/2003 | Cleaver et al. |
| 6,596,977 B2 | 7/2003 | Muthu et al. |
| 6,598,996 B1 | 7/2003 | Lodhie |
| 6,608,453 B2 | 8/2003 | Morgan et al. |
| 6,608,614 B1 | 8/2003 | Johnson |
| 6,609,804 B2 | 8/2003 | Nolan et al. |
| 6,609,813 B1 * | 8/2003 | Showers et al. ............ 362/240 |
| 6,612,712 B2 | 9/2003 | Nepil |
| 6,612,717 B2 | 9/2003 | Yen |
| 6,621,222 B1 | 9/2003 | Hong |
| 6,623,151 B2 | 9/2003 | Pederson |
| 6,624,597 B2 | 9/2003 | Dowling et al. |
| D481,484 S | 10/2003 | Cuevas et al. |
| 6,634,770 B2 | 10/2003 | Cao |
| 6,634,779 B2 | 10/2003 | Reed |
| 6,636,003 B2 | 10/2003 | Rahm et al. |
| 6,639,349 B1 | 10/2003 | Bahadur |
| 6,641,284 B2 | 11/2003 | Stopa et al. |
| 6,659,622 B2 | 12/2003 | Katogi et al. |
| 6,660,935 B2 | 12/2003 | Southard et al. |
| 6,666,689 B1 | 12/2003 | Savage, Jr. |
| 6,667,623 B2 | 12/2003 | Bourgault et al. |
| 6,674,096 B2 | 1/2004 | Sommers |
| 6,676,284 B1 | 1/2004 | Wynne Willson |
| 6,679,621 B2 | 1/2004 | West et al. |
| 6,681,154 B2 | 1/2004 | Nierlich et al. |
| 6,682,205 B2 | 1/2004 | Lin |
| 6,683,419 B2 | 1/2004 | Kriparos |
| 6,700,136 B2 | 3/2004 | Guida |
| 6,712,486 B1 | 3/2004 | Popovich et al. |
| 6,717,376 B2 | 4/2004 | Lys et al. |
| 6,717,526 B2 | 4/2004 | Martineau et al. |
| 6,720,745 B2 | 4/2004 | Lys et al. |
| 6,726,348 B2 | 4/2004 | Gloisten |
| 6,741,324 B1 | 5/2004 | Kim |
| D491,678 S | 6/2004 | Piepgras |
| D492,042 S | 6/2004 | Piepgras |
| 6,744,223 B2 | 6/2004 | Laflamme et al. |
| 6,748,299 B1 | 6/2004 | Motoyama |
| 6,762,562 B2 | 7/2004 | Leong |
| 6,774,584 B2 | 8/2004 | Lys et al. |
| 6,777,891 B2 | 8/2004 | Lys et al. |
| 6,781,329 B2 | 8/2004 | Mueller et al. |
| 6,787,999 B2 | 9/2004 | Stimac et al. |
| 6,788,000 B2 | 9/2004 | Appelberg et al. |
| 6,788,011 B2 | 9/2004 | Mueller et al. |
| 6,791,840 B2 | 9/2004 | Chun |
| 6,796,680 B1 | 9/2004 | Showers et al. |
| 6,801,003 B2 | 10/2004 | Schanberger et al. |
| 6,803,732 B2 | 10/2004 | Kraus et al. |
| 6,806,659 B1 | 10/2004 | Mueller et al. |
| 6,814,470 B2 | 11/2004 | Rizkin et al. |
| 6,815,724 B2 | 11/2004 | Dry |
| 6,846,094 B2 | 1/2005 | Luk |

(56) References Cited

U.S. PATENT DOCUMENTS

| | | |
|---|---|---|
| 6,851,816 B2 | 2/2005 | Wu et al. |
| 6,851,832 B2 | 2/2005 | Tieszen |
| 6,853,150 B2 | 2/2005 | Clauberg et al. |
| 6,853,151 B2 | 2/2005 | Leong et al. |
| 6,853,563 B1 | 2/2005 | Yang et al. |
| 6,857,924 B2 | 2/2005 | Fu et al. |
| 6,860,628 B2 | 3/2005 | Robertson et al. |
| 6,866,401 B2 | 3/2005 | Sommers et al. |
| 6,869,204 B2 | 3/2005 | Morgan et al. |
| 6,871,981 B2 | 3/2005 | Alexanderson et al. |
| 6,874,924 B1 | 4/2005 | Hulse et al. |
| 6,879,883 B1 | 4/2005 | Motoyama |
| 6,882,111 B2 | 4/2005 | Kan et al. |
| 6,883,929 B2 | 4/2005 | Dowling |
| 6,883,934 B2 | 4/2005 | Kawakami et al. |
| 6,888,322 B2 | 5/2005 | Dowling et al. |
| 6,897,624 B2 | 5/2005 | Lys et al. |
| 6,909,239 B2 | 6/2005 | Gauna |
| 6,909,921 B1 | 6/2005 | Bilger |
| 6,918,680 B2 | 7/2005 | Seeberger |
| 6,921,181 B2 | 7/2005 | Yen |
| 6,936,968 B2 | 8/2005 | Cross et al. |
| 6,936,978 B2 | 8/2005 | Morgan et al. |
| 6,940,230 B2 | 9/2005 | Myron et al. |
| 6,948,829 B2 | 9/2005 | Verdes et al. |
| 6,957,905 B1 | 10/2005 | Pritvchard et al. |
| 6,963,175 B2 | 11/2005 | Archenhold et al. |
| 6,964,501 B2 | 11/2005 | Ryan |
| 6,965,197 B2 | 11/2005 | Tyan et al. |
| 6,965,205 B2 | 11/2005 | Piepgras et al. |
| 6,967,448 B2 | 11/2005 | Morgan et al. |
| 6,969,179 B2 | 11/2005 | Sloan et al. |
| 6,969,186 B2 | 11/2005 | Sonderegger et al. |
| 6,969,954 B2 | 11/2005 | Lys |
| 6,975,079 B2 | 12/2005 | Lys et al. |
| 6,979,097 B2 | 12/2005 | Elam et al. |
| 6,982,518 B2 | 1/2006 | Chou et al. |
| 6,995,681 B2 | 2/2006 | Pederson |
| 6,997,576 B1 | 2/2006 | Lodhie et al. |
| 7,004,603 B2 | 2/2006 | Knight |
| D518,218 S | 3/2006 | Roberge et al. |
| 7,008,079 B2 | 3/2006 | Smith |
| 7,014,336 B1 | 3/2006 | Ducharme et al. |
| 7,015,650 B2 | 3/2006 | McGrath |
| 7,018,063 B2 | 3/2006 | Michael et al. |
| 7,021,799 B2 | 4/2006 | Mizuyoshi |
| 7,021,809 B2 | 4/2006 | Iwasa et al. |
| 7,024,256 B2 | 4/2006 | Krzyzanowski et al. |
| 7,031,920 B2 | 4/2006 | Dowling et al. |
| 7,033,036 B2 | 4/2006 | Pederson |
| 7,038,398 B1 | 5/2006 | Lys et al. |
| 7,038,399 B2 | 5/2006 | Lys et al. |
| 7,042,172 B2 | 5/2006 | Dowling et al. |
| 7,048,423 B2 | 5/2006 | Stepanenko et al. |
| 7,049,761 B2 | 5/2006 | Timmermans et al. |
| 7,052,171 B1 | 5/2006 | Lefebvre et al. |
| 7,053,557 B2 * | 5/2006 | Cross et al. ............... 315/74 |
| 7,064,498 B2 | 6/2006 | Dowling et al. |
| 7,064,674 B2 | 6/2006 | Pederson |
| 7,067,992 B2 | 6/2006 | Leong et al. |
| 7,077,978 B2 | 7/2006 | Setlur et al. |
| 7,080,927 B2 | 7/2006 | Feuerborn et al. |
| 7,086,747 B2 | 8/2006 | Nielson et al. |
| 7,088,014 B2 | 8/2006 | Nierlich et al. |
| 7,088,904 B2 | 8/2006 | Ryan, Jr. |
| 7,102,902 B1 | 9/2006 | Brown et al. |
| 7,113,541 B1 | 9/2006 | Lys et al. |
| 7,114,830 B2 | 10/2006 | Robertson et al. |
| 7,114,834 B2 | 10/2006 | Rivas et al. |
| 7,118,262 B2 | 10/2006 | Negley |
| 7,119,503 B2 | 10/2006 | Kemper |
| 7,121,679 B2 | 10/2006 | Fujimoto |
| 7,122,976 B1 | 10/2006 | Null et al. |
| 7,128,442 B2 | 10/2006 | Lee et al. |
| 7,128,454 B2 | 10/2006 | Kim et al. |
| D532,532 S | 11/2006 | Maxik |
| 7,132,635 B2 | 11/2006 | Dowling |
| 7,132,785 B2 * | 11/2006 | Ducharme ............... 313/501 |
| 7,132,804 B2 | 11/2006 | Lys et al. |
| 7,135,824 B2 | 11/2006 | Lys et al. |
| 7,139,617 B1 | 11/2006 | Morgan et al. |
| 7,144,135 B2 | 12/2006 | Martin et al. |
| 7,153,002 B2 | 12/2006 | Kim et al. |
| 7,161,311 B2 | 1/2007 | Mueller et al. |
| 7,161,313 B2 | 1/2007 | Piepgras et al. |
| 7,161,556 B2 | 1/2007 | Morgan et al. |
| 7,164,110 B2 | 1/2007 | Pitigoi-Aron et al. |
| 7,164,235 B2 | 1/2007 | Ito et al. |
| 7,165,863 B1 | 1/2007 | Thomas et al. |
| 7,165,866 B2 | 1/2007 | Li |
| 7,167,777 B2 | 1/2007 | Budike, Jr. |
| 7,168,843 B2 | 1/2007 | Striebel |
| D536,468 S | 2/2007 | Crosby |
| 7,178,941 B2 | 2/2007 | Roberge et al. |
| 7,180,252 B2 | 2/2007 | Lys et al. |
| D538,950 S | 3/2007 | Maxik |
| D538,952 S | 3/2007 | Maxik et al. |
| D538,962 S | 3/2007 | Elliott |
| 7,186,003 B2 | 3/2007 | Dowling et al. |
| 7,186,005 B2 | 3/2007 | Hulse |
| 7,187,141 B2 | 3/2007 | Mueller et al. |
| 7,190,126 B1 | 3/2007 | Paton |
| 7,192,154 B2 | 3/2007 | Becker |
| 7,198,387 B1 | 4/2007 | Gloisten et al. |
| 7,201,491 B2 | 4/2007 | Bayat et al. |
| 7,201,497 B2 | 4/2007 | Weaver, Jr. et al. |
| 7,202,613 B2 | 4/2007 | Morgan et al. |
| 7,204,615 B2 | 4/2007 | Arik et al. |
| 7,204,622 B2 | 4/2007 | Dowling et al. |
| 7,207,696 B1 | 4/2007 | Lin |
| 7,210,818 B2 | 5/2007 | Luk et al. |
| 7,210,957 B2 | 5/2007 | Mrakovich |
| 7,211,959 B1 | 5/2007 | Chou |
| 7,213,934 B2 | 5/2007 | Zarian et al. |
| 7,217,004 B2 | 5/2007 | Park et al. |
| 7,217,012 B2 | 5/2007 | Southard et al. |
| 7,217,022 B2 | 5/2007 | Ruffin |
| 7,218,056 B1 | 5/2007 | Harwood |
| 7,218,238 B2 | 5/2007 | Right et al. |
| 7,220,015 B2 | 5/2007 | Dowling |
| 7,220,018 B2 | 5/2007 | Crabb et al. |
| 7,221,104 B2 | 5/2007 | Lys et al. |
| 7,221,110 B2 | 5/2007 | Sears et al. |
| 7,224,000 B2 | 5/2007 | Aanegola et al. |
| 7,226,189 B2 | 6/2007 | Lee et al. |
| 7,228,052 B1 | 6/2007 | Lin |
| 7,228,190 B2 | 6/2007 | Dowling et al. |
| 7,231,060 B2 | 6/2007 | Dowling et al. |
| 7,233,115 B2 | 6/2007 | Lys |
| 7,233,831 B2 | 6/2007 | Blackwell |
| 7,236,366 B2 | 6/2007 | Chen |
| 7,237,924 B2 | 7/2007 | Martineau et al. |
| 7,237,925 B2 | 7/2007 | Mayer et al. |
| 7,239,532 B1 | 7/2007 | Hsu et al. |
| 7,241,038 B2 | 7/2007 | Naniwa et al. |
| 7,242,152 B2 | 7/2007 | Dowling et al. |
| 7,246,926 B2 | 7/2007 | Harwood |
| 7,246,931 B2 | 7/2007 | Hsieh et al. |
| 7,248,239 B2 | 7/2007 | Dowling et al. |
| 7,249,269 B1 | 7/2007 | Motoyama |
| 7,249,865 B2 | 7/2007 | Robertson |
| D548,868 S | 8/2007 | Roberge et al. |
| 7,252,408 B2 | 8/2007 | Mazzochette et al. |
| 7,253,566 B2 | 8/2007 | Lys et al. |
| 7,255,457 B2 | 8/2007 | Ducharme et al. |
| 7,255,460 B2 | 8/2007 | Lee |
| 7,256,554 B2 | 8/2007 | Lys |
| 7,258,458 B2 | 8/2007 | Mochiachvili et al. |
| 7,258,467 B2 | 8/2007 | Saccomanno et al. |
| 7,259,528 B2 | 8/2007 | Pilz |
| 7,262,439 B2 | 8/2007 | Setlur et al. |
| D550,379 S * | 9/2007 | Hoshikawa et al. ........... D26/25 |
| 7,264,372 B2 | 9/2007 | Maglica |
| 7,267,467 B2 | 9/2007 | Wu et al. |

(56) References Cited

U.S. PATENT DOCUMENTS

| | | | |
|---|---|---|---|
| 7,270,443 B2 | 9/2007 | Kurtz et al. |
| 7,271,794 B1 | 9/2007 | Cheng et al. |
| 7,273,300 B2 | 9/2007 | Mrakovich |
| 7,274,045 B2 | 9/2007 | Chandran et al. |
| 7,274,160 B2 | 9/2007 | Mueller et al. |
| D553,267 S | 10/2007 | Yuen |
| 7,285,801 B2 | 10/2007 | Eliashevich et al. |
| 7,288,902 B1 | 10/2007 | Melanson |
| 7,296,912 B2 | 11/2007 | Beauchamp |
| 7,300,184 B2 | 11/2007 | Ichikawa et al. |
| 7,300,192 B2 | 11/2007 | Mueller et al. |
| D556,937 S | 12/2007 | Ly |
| D557,854 S | 12/2007 | Lewis |
| 7,303,300 B2 | 12/2007 | Dowling et al. |
| 7,306,353 B2 | 12/2007 | Popovich et al. |
| 7,307,391 B2 | 12/2007 | Shan |
| 7,308,296 B2 | 12/2007 | Lys et al. |
| 7,309,965 B2 | 12/2007 | Dowling et al. |
| 7,318,658 B2 | 1/2008 | Wang et al. |
| 7,319,244 B2 | 1/2008 | Liu et al. |
| 7,319,246 B2 | 1/2008 | Soules et al. |
| 7,321,191 B2 | 1/2008 | Setlur et al. |
| 7,326,964 B2 | 2/2008 | Lim et al. |
| 7,327,281 B2 | 2/2008 | Hutchison |
| 7,329,031 B2 | 2/2008 | Liaw et al. |
| D563,589 S | 3/2008 | Hariri et al. |
| 7,345,320 B2 | 3/2008 | Dahm |
| 7,348,604 B2 | 3/2008 | Matheson |
| 7,350,936 B2 | 4/2008 | Ducharme et al. |
| 7,350,952 B2 | 4/2008 | Nishigaki |
| 7,352,138 B2 | 4/2008 | Lys et al. |
| 7,352,339 B2 | 4/2008 | Morgan et al. |
| 7,353,071 B2 | 4/2008 | Blackwell et al. |
| 7,358,679 B2 | 4/2008 | Lys et al. |
| 7,358,929 B2 | 4/2008 | Mueller et al. |
| 7,370,986 B2 * | 5/2008 | Chan ........................ 362/84 |
| 7,374,327 B2 | 5/2008 | Schexnaider |
| 7,385,359 B2 | 6/2008 | Dowling et al. |
| 7,391,159 B2 | 6/2008 | Harwood |
| 7,396,146 B2 | 7/2008 | Wang |
| 7,401,935 B2 | 7/2008 | VanderSchuit |
| 7,401,945 B2 | 7/2008 | Zhang |
| 7,427,840 B2 | 9/2008 | Morgan et al. |
| 7,429,117 B2 | 9/2008 | Pohlert et al. |
| 7,434,964 B1 | 10/2008 | Zheng et al. |
| 7,438,441 B2 | 10/2008 | Sun et al. |
| D580,089 S | 11/2008 | Ly et al. |
| D581,556 S | 11/2008 | To et al. |
| 7,449,847 B2 | 11/2008 | Schanberger et al. |
| D582,577 S | 12/2008 | Yuen |
| D584,428 S | 1/2009 | Li et al. |
| 7,476,002 B2 | 1/2009 | Wolf et al. |
| 7,476,004 B2 | 1/2009 | Chan |
| 7,478,924 B2 | 1/2009 | Robertson |
| D586,484 S | 2/2009 | Liu et al. |
| D586,928 S | 2/2009 | Liu et al. |
| 7,490,957 B2 | 2/2009 | Leong et al. |
| 7,497,596 B2 | 3/2009 | Ge |
| 7,507,001 B2 | 3/2009 | Kit |
| 7,510,299 B2 | 3/2009 | Timmermans et al. |
| 7,520,635 B2 | 4/2009 | Wolf et al. |
| 7,521,872 B2 | 4/2009 | Bruning |
| 7,524,089 B2 | 4/2009 | Park |
| D592,766 S | 5/2009 | Zhu et al. |
| D593,223 S | 5/2009 | Komar |
| 7,534,002 B2 | 5/2009 | Yamaguchi et al. |
| 7,549,769 B2 | 6/2009 | Kim et al. |
| 7,556,396 B2 | 7/2009 | Kuo et al. |
| 7,572,030 B2 | 8/2009 | Booth et al. |
| 7,575,339 B2 | 8/2009 | Hung |
| 7,579,786 B2 | 8/2009 | Soos |
| 7,583,035 B2 | 9/2009 | Shteynberg et al. |
| 7,602,559 B2 | 10/2009 | Jang et al. |
| 7,619,366 B2 | 11/2009 | Diederiks |
| 7,635,201 B2 | 12/2009 | Deng |
| 7,639,517 B2 | 12/2009 | Zhou et al. |
| 7,661,839 B2 * | 2/2010 | Tsai ........................... 362/223 |
| D612,528 S | 3/2010 | McGrath et al. |
| 7,690,813 B2 | 4/2010 | Kanamori et al. |
| 7,710,047 B2 | 5/2010 | Shteynberg et al. |
| 7,712,918 B2 * | 5/2010 | Siemiet et al. ............... 362/241 |
| 7,828,471 B2 | 11/2010 | Lin |
| 7,843,150 B2 | 11/2010 | Wang et al. |
| 2001/0033488 A1 | 10/2001 | Chliwnyj et al. |
| 2001/0045803 A1 | 11/2001 | Cencur |
| 2002/0011801 A1 | 1/2002 | Chang |
| 2002/0038157 A1 | 3/2002 | Dowling et al. |
| 2002/0044066 A1 | 4/2002 | Dowling et al. |
| 2002/0047569 A1 | 4/2002 | Dowling et al. |
| 2002/0047624 A1 | 4/2002 | Stam et al. |
| 2002/0047628 A1 | 4/2002 | Morgan et al. |
| 2002/0048169 A1 | 4/2002 | Dowling et al. |
| 2002/0057061 A1 | 5/2002 | Mueller et al. |
| 2002/0060526 A1 | 5/2002 | Timmermans et al. |
| 2002/0070688 A1 | 6/2002 | Dowling et al. |
| 2002/0074559 A1 | 6/2002 | Dowling et al. |
| 2002/0074958 A1 | 6/2002 | Crenshaw |
| 2002/0078221 A1 | 6/2002 | Blackwell et al. |
| 2002/0101197 A1 | 8/2002 | Lys et al. |
| 2002/0113555 A1 | 8/2002 | Lys et al. |
| 2002/0130627 A1 | 9/2002 | Morgan et al. |
| 2002/0145394 A1 | 10/2002 | Morgan et al. |
| 2002/0145869 A1 | 10/2002 | Dowling |
| 2002/0152045 A1 | 10/2002 | Dowling et al. |
| 2002/0152298 A1 | 10/2002 | Kikta et al. |
| 2002/0153851 A1 | 10/2002 | Morgan et al. |
| 2002/0158583 A1 | 10/2002 | Lys et al. |
| 2002/0163316 A1 | 11/2002 | Lys et al. |
| 2002/0171365 A1 | 11/2002 | Morgan et al. |
| 2002/0171377 A1 | 11/2002 | Mueller et al. |
| 2002/0171378 A1 | 11/2002 | Morgan et al. |
| 2002/0176259 A1 | 11/2002 | Ducharme |
| 2002/0179816 A1 | 12/2002 | Haines et al. |
| 2002/0195975 A1 | 12/2002 | Schanberger et al. |
| 2003/0011538 A1 | 1/2003 | Lys et al. |
| 2003/0028260 A1 | 2/2003 | Blackwell |
| 2003/0031015 A1 | 2/2003 | Ishibashi |
| 2003/0048641 A1 | 3/2003 | Alexanderson et al. |
| 2003/0057884 A1 | 3/2003 | Dowling et al. |
| 2003/0057886 A1 | 3/2003 | Lys et al. |
| 2003/0057887 A1 | 3/2003 | Dowling et al. |
| 2003/0057890 A1 | 3/2003 | Lys et al. |
| 2003/0076281 A1 | 4/2003 | Morgan et al. |
| 2003/0085710 A1 | 5/2003 | Bourgault et al. |
| 2003/0095404 A1 | 5/2003 | Becks et al. |
| 2003/0100837 A1 | 5/2003 | Lys et al. |
| 2003/0102810 A1 | 6/2003 | Cross et al. |
| 2003/0133292 A1 | 7/2003 | Mueller et al. |
| 2003/0137258 A1 | 7/2003 | Piepgras et al. |
| 2003/0185005 A1 | 10/2003 | Sommers et al. |
| 2003/0185014 A1 | 10/2003 | Gloisten |
| 2003/0189412 A1 | 10/2003 | Cunningham |
| 2003/0222587 A1 | 12/2003 | Dowling, Jr. et al. |
| 2004/0003545 A1 | 1/2004 | Gillespie |
| 2004/0012959 A1 | 1/2004 | Robertson et al. |
| 2004/0036006 A1 | 2/2004 | Dowling |
| 2004/0037088 A1 | 2/2004 | English et al. |
| 2004/0052076 A1 | 3/2004 | Mueller et al. |
| 2004/0062041 A1 | 4/2004 | Cross et al. |
| 2004/0075572 A1 | 4/2004 | Buschmann et al. |
| 2004/0080960 A1 | 4/2004 | Wu |
| 2004/0090191 A1 | 5/2004 | Mueller et al. |
| 2004/0090787 A1 | 5/2004 | Dowling et al. |
| 2004/0105261 A1 | 6/2004 | Ducharme et al. |
| 2004/0105264 A1 | 6/2004 | Spero |
| 2004/0113568 A1 | 6/2004 | Dowling et al. |
| 2004/0116039 A1 | 6/2004 | Mueller et al. |
| 2004/0124782 A1 | 7/2004 | Yu |
| 2004/0130909 A1 | 7/2004 | Mueller et al. |
| 2004/0141321 A1 | 7/2004 | Dowling et al. |
| 2004/0155609 A1 | 8/2004 | Lys et al. |
| 2004/0160199 A1 | 8/2004 | Morgan et al. |
| 2004/0178751 A1 | 9/2004 | Mueller et al. |
| 2004/0189218 A1 | 9/2004 | Leong et al. |

(56) References Cited

U.S. PATENT DOCUMENTS

| | | |
|---|---|---|
| 2004/0189262 A1 | 9/2004 | McGrath |
| 2004/0212320 A1 | 10/2004 | Dowling et al. |
| 2004/0212321 A1 | 10/2004 | Lys et al. |
| 2004/0212993 A1 | 10/2004 | Morgan et al. |
| 2004/0223328 A1 | 11/2004 | Lee et al. |
| 2004/0240890 A1 | 12/2004 | Lys et al. |
| 2004/0251854 A1 | 12/2004 | Matsuda et al. |
| 2004/0257007 A1 | 12/2004 | Lys et al. |
| 2005/0013133 A1 | 1/2005 | Yeh |
| 2005/0024877 A1 | 2/2005 | Frederick |
| 2005/0030744 A1 | 2/2005 | Ducharme et al. |
| 2005/0035728 A1 | 2/2005 | Schanberger et al. |
| 2005/0036300 A1 | 2/2005 | Dowling et al. |
| 2005/0040774 A1 | 2/2005 | Mueller et al. |
| 2005/0041161 A1 | 2/2005 | Dowling et al. |
| 2005/0041424 A1 | 2/2005 | Ducharme |
| 2005/0043907 A1 | 2/2005 | Eckel et al. |
| 2005/0044617 A1 | 3/2005 | Mueller et al. |
| 2005/0047132 A1 | 3/2005 | Dowling et al. |
| 2005/0047134 A1 | 3/2005 | Mueller et al. |
| 2005/0062440 A1 | 3/2005 | Lys et al. |
| 2005/0063194 A1 | 3/2005 | Lys et al. |
| 2005/0078477 A1 | 4/2005 | Lo |
| 2005/0099824 A1 | 5/2005 | Dowling et al. |
| 2005/0107694 A1 | 5/2005 | Jansen et al. |
| 2005/0110384 A1 | 5/2005 | Peterson |
| 2005/0116667 A1 | 6/2005 | Mueller et al. |
| 2005/0128751 A1 | 6/2005 | Roberge et al. |
| 2005/0141225 A1 | 6/2005 | Striebel |
| 2005/0151489 A1 | 7/2005 | Lys et al. |
| 2005/0151663 A1 | 7/2005 | Tanguay |
| 2005/0154494 A1 | 7/2005 | Ahmed |
| 2005/0174473 A1 | 8/2005 | Morgan et al. |
| 2005/0174780 A1 | 8/2005 | Park |
| 2005/0184667 A1 | 8/2005 | Sturman et al. |
| 2005/0201112 A1 | 9/2005 | Machi et al. |
| 2005/0206529 A1 | 9/2005 | St.-Germain |
| 2005/0213320 A1 | 9/2005 | Kazuhiro et al. |
| 2005/0213352 A1 | 9/2005 | Lys |
| 2005/0213353 A1 | 9/2005 | Lys |
| 2005/0218838 A1 | 10/2005 | Lys |
| 2005/0218870 A1 | 10/2005 | Lys |
| 2005/0219860 A1 | 10/2005 | Schexnaider |
| 2005/0219872 A1 | 10/2005 | Lys |
| 2005/0225979 A1 | 10/2005 | Robertson et al. |
| 2005/0231133 A1 | 10/2005 | Lys |
| 2005/0236029 A1 | 10/2005 | Dowling |
| 2005/0236998 A1 | 10/2005 | Mueller et al. |
| 2005/0248299 A1 | 11/2005 | Chemel et al. |
| 2005/0253533 A1 | 11/2005 | Lys et al. |
| 2005/0259424 A1 | 11/2005 | Zampini, II et al. |
| 2005/0265019 A1 | 12/2005 | Sommers et al. |
| 2005/0275626 A1 | 12/2005 | Mueller et al. |
| 2005/0276051 A1 | 12/2005 | Caudle et al. |
| 2005/0276053 A1 | 12/2005 | Nortrup et al. |
| 2005/0276064 A1 | 12/2005 | Wu et al. |
| 2005/0285547 A1 | 12/2005 | Piepgras et al. |
| 2006/0002110 A1 | 1/2006 | Dowling et al. |
| 2006/0012987 A9 | 1/2006 | Ducharme et al. |
| 2006/0012997 A1 | 1/2006 | Catalano et al. |
| 2006/0016960 A1 | 1/2006 | Morgan et al. |
| 2006/0022214 A1 | 2/2006 | Morgan et al. |
| 2006/0028155 A1 | 2/2006 | Young |
| 2006/0028837 A1 | 2/2006 | Mrakovich |
| 2006/0034078 A1 | 2/2006 | Kovacik et al. |
| 2006/0050509 A9 | 3/2006 | Dowling et al. |
| 2006/0050514 A1 | 3/2006 | Opolka |
| 2006/0076908 A1 | 4/2006 | Morgan et al. |
| 2006/0092640 A1 | 5/2006 | Li |
| 2006/0098077 A1 | 5/2006 | Dowling |
| 2006/0104058 A1 | 5/2006 | Chemel et al. |
| 2006/0109648 A1 | 5/2006 | Trenchard et al. |
| 2006/0109649 A1 | 5/2006 | Ducharme et al. |
| 2006/0109661 A1 | 5/2006 | Coushaine et al. |
| 2006/0126325 A1 | 6/2006 | Lefebvre et al. |
| 2006/0126338 A1 | 6/2006 | Mighetto |
| 2006/0132061 A1 | 6/2006 | McCormick et al. |
| 2006/0132323 A1 | 6/2006 | Grady, Jr. |
| 2006/0146531 A1 | 7/2006 | Reo et al. |
| 2006/0152172 A9 | 7/2006 | Mueller et al. |
| 2006/0158881 A1 | 7/2006 | Dowling |
| 2006/0170376 A1 | 8/2006 | Piepgras et al. |
| 2006/0192502 A1 | 8/2006 | Brown et al. |
| 2006/0193131 A1 | 8/2006 | McGrath et al. |
| 2006/0197661 A1 | 9/2006 | Tracy et al. |
| 2006/0198128 A1 | 9/2006 | Piepgras et al. |
| 2006/0208667 A1 | 9/2006 | Lys et al. |
| 2006/0215422 A1* | 9/2006 | Laizure et al. ................ 362/650 |
| 2006/0220595 A1 | 10/2006 | Lu |
| 2006/0221606 A1 | 10/2006 | Dowling |
| 2006/0221619 A1 | 10/2006 | Nishigaki |
| 2006/0232974 A1 | 10/2006 | Lee et al. |
| 2006/0262516 A9 | 11/2006 | Dowling et al. |
| 2006/0262521 A1 | 11/2006 | Piepgras et al. |
| 2006/0262544 A1 | 11/2006 | Piepgras et al. |
| 2006/0262545 A1 | 11/2006 | Piepgras et al. |
| 2006/0265921 A1 | 11/2006 | Korall et al. |
| 2006/0273741 A1 | 12/2006 | Stalker, III |
| 2006/0274529 A1 | 12/2006 | Cao |
| 2006/0285325 A1 | 12/2006 | Ducharme et al. |
| 2007/0035255 A1 | 2/2007 | Shuster et al. |
| 2007/0035538 A1 | 2/2007 | Garcia et al. |
| 2007/0035965 A1 | 2/2007 | Holst |
| 2007/0040516 A1 | 2/2007 | Chen |
| 2007/0041220 A1 | 2/2007 | Lynch |
| 2007/0047227 A1 | 3/2007 | Ducharme |
| 2007/0053182 A1 | 3/2007 | Robertson |
| 2007/0053208 A1 | 3/2007 | Justel et al. |
| 2007/0064419 A1 | 3/2007 | Gandhi |
| 2007/0064425 A1 | 3/2007 | Frecska et al. |
| 2007/0070621 A1 | 3/2007 | Rivas et al. |
| 2007/0070631 A1 | 3/2007 | Huang et al. |
| 2007/0081423 A1 | 4/2007 | Chien |
| 2007/0086754 A1 | 4/2007 | Lys et al. |
| 2007/0086912 A1 | 4/2007 | Dowling et al. |
| 2007/0097678 A1 | 5/2007 | Yang |
| 2007/0109763 A1 | 5/2007 | Wolf et al. |
| 2007/0115658 A1 | 5/2007 | Mueller et al. |
| 2007/0115665 A1 | 5/2007 | Mueller et al. |
| 2007/0120594 A1 | 5/2007 | Balakrishnan et al. |
| 2007/0127234 A1 | 6/2007 | Jervey, III |
| 2007/0133202 A1 | 6/2007 | Huang et al. |
| 2007/0139938 A1 | 6/2007 | Petroski et al. |
| 2007/0145915 A1 | 6/2007 | Roberge et al. |
| 2007/0147046 A1 | 6/2007 | Arik et al. |
| 2007/0152797 A1 | 7/2007 | Chemel et al. |
| 2007/0152808 A1 | 7/2007 | LaCasse |
| 2007/0153514 A1 | 7/2007 | Dowling et al. |
| 2007/0159828 A1 | 7/2007 | Wang |
| 2007/0165402 A1 | 7/2007 | Weaver, Jr. et al. |
| 2007/0173978 A1 | 7/2007 | Fein et al. |
| 2007/0177382 A1 | 8/2007 | Pritchard et al. |
| 2007/0182387 A1 | 8/2007 | Weirich |
| 2007/0188114 A1 | 8/2007 | Lys et al. |
| 2007/0188427 A1 | 8/2007 | Lys et al. |
| 2007/0189026 A1 | 8/2007 | Chemel et al. |
| 2007/0195526 A1 | 8/2007 | Dowling et al. |
| 2007/0195527 A1 | 8/2007 | Russell |
| 2007/0195532 A1 | 8/2007 | Reisenauer et al. |
| 2007/0205712 A1 | 9/2007 | Radkov et al. |
| 2007/0206375 A1 | 9/2007 | Piepgras et al. |
| 2007/0211463 A1 | 9/2007 | Chevalier et al. |
| 2007/0228999 A1 | 10/2007 | Kit |
| 2007/0235751 A1 | 10/2007 | Radkov et al. |
| 2007/0236156 A1 | 10/2007 | Lys et al. |
| 2007/0237284 A1 | 10/2007 | Lys et al. |
| 2007/0240346 A1 | 10/2007 | Li et al. |
| 2007/0241657 A1 | 10/2007 | Radkov et al. |
| 2007/0242466 A1 | 10/2007 | Wu et al. |
| 2007/0247450 A1 | 10/2007 | Lee |
| 2007/0247842 A1 | 10/2007 | Zampini et al. |
| 2007/0247847 A1 | 10/2007 | Villard |
| 2007/0247851 A1 | 10/2007 | Villard |
| 2007/0258231 A1 | 11/2007 | Koerner et al. |

(56) References Cited

U.S. PATENT DOCUMENTS

| | | |
|---|---|---|
| 2007/0258240 A1 | 11/2007 | Ducharme et al. |
| 2007/0263379 A1 | 11/2007 | Dowling |
| 2007/0274070 A1 | 11/2007 | Wedell |
| 2007/0281520 A1 | 12/2007 | Insalaco et al. |
| 2007/0285926 A1 | 12/2007 | Maxik |
| 2007/0285933 A1 | 12/2007 | Southard et al. |
| 2007/0290625 A1 | 12/2007 | He et al. |
| 2007/0291483 A1 | 12/2007 | Lys |
| 2007/0296350 A1 | 12/2007 | Maxik et al. |
| 2008/0003664 A1 | 1/2008 | Tysoe et al. |
| 2008/0007945 A1 | 1/2008 | Kelly et al. |
| 2008/0012502 A1 | 1/2008 | Lys |
| 2008/0012506 A1 | 1/2008 | Mueller et al. |
| 2008/0013316 A1 | 1/2008 | Chiang |
| 2008/0013324 A1 | 1/2008 | Yu |
| 2008/0018261 A1 | 1/2008 | Kastner |
| 2008/0024067 A1 | 1/2008 | Ishibashi |
| 2008/0037226 A1 | 2/2008 | Shin et al. |
| 2008/0037245 A1 | 2/2008 | Chan |
| 2008/0037284 A1 | 2/2008 | Rudisill |
| 2008/0062680 A1 | 3/2008 | Timmermans et al. |
| 2008/0080181 A1 | 4/2008 | Yu et al. |
| 2008/0089075 A1 | 4/2008 | Hsu |
| 2008/0092800 A1 | 4/2008 | Smith et al. |
| 2008/0093615 A1 | 4/2008 | Lin et al. |
| 2008/0093998 A1 | 4/2008 | Dennery et al. |
| 2008/0094837 A1 | 4/2008 | Dobbins et al. |
| 2008/0130267 A1 | 6/2008 | Dowling et al. |
| 2008/0151535 A1 | 6/2008 | de Castris |
| 2008/0158871 A1 | 7/2008 | McAvoy et al. |
| 2008/0158887 A1 | 7/2008 | Zhu et al. |
| 2008/0164826 A1 | 7/2008 | Lys |
| 2008/0164827 A1 | 7/2008 | Lys |
| 2008/0164854 A1 | 7/2008 | Lys |
| 2008/0175003 A1 | 7/2008 | Tsou et al. |
| 2008/0180036 A1 | 7/2008 | Garrity et al. |
| 2008/0186704 A1 | 8/2008 | Chou et al. |
| 2008/0192436 A1 | 8/2008 | Peng et al. |
| 2008/0198598 A1 | 8/2008 | Ward |
| 2008/0211386 A1 | 9/2008 | Choi et al. |
| 2008/0211419 A1 | 9/2008 | Garrity |
| 2008/0218993 A1 | 9/2008 | Li |
| 2008/0224629 A1 | 9/2008 | Melanson |
| 2008/0224636 A1 | 9/2008 | Melanson |
| 2008/0253125 A1 | 10/2008 | Kang et al. |
| 2008/0258647 A1 | 10/2008 | Scianna |
| 2008/0285257 A1 | 11/2008 | King |
| 2008/0285266 A1 | 11/2008 | Thomas |
| 2008/0290814 A1 | 11/2008 | Leong et al. |
| 2008/0291675 A1 | 11/2008 | Lin et al. |
| 2008/0304250 A1* | 12/2008 | Harbers et al. .................. 362/84 |
| 2008/0315773 A1 | 12/2008 | Pang |
| 2008/0315784 A1 | 12/2008 | Tseng |
| 2009/0002995 A1 | 1/2009 | Lee et al. |
| 2009/0016063 A1 | 1/2009 | Hu |
| 2009/0021140 A1 | 1/2009 | Takasu et al. |
| 2009/0027916 A1* | 1/2009 | Huang et al. .................. 362/581 |
| 2009/0046473 A1 | 2/2009 | Tsai et al. |
| 2009/0052186 A1 | 2/2009 | Xue |
| 2009/0067182 A1 | 3/2009 | Hsu et al. |
| 2009/0086492 A1 | 4/2009 | Meyer |
| 2009/0091938 A1 | 4/2009 | Jacobson et al. |
| 2009/0140285 A1 | 6/2009 | Lin et al. |
| 2009/0175041 A1 | 7/2009 | Yuen et al. |
| 2009/0185373 A1 | 7/2009 | Grajcar |
| 2009/0195186 A1 | 8/2009 | Guest et al. |
| 2009/0196034 A1 | 8/2009 | Gherardini et al. |
| 2009/0213588 A1 | 8/2009 | Manes |
| 2009/0231831 A1 | 9/2009 | Hsiao et al. |
| 2009/0273926 A1 | 11/2009 | Deng |
| 2009/0284970 A1* | 11/2009 | Graf et al. .................. 362/247 |
| 2009/0302343 A1 | 12/2009 | Sato et al. |
| 2009/0303720 A1 | 12/2009 | Mcgrath |
| 2009/0316408 A1 | 12/2009 | Villard |
| 2010/0008085 A1 | 1/2010 | Ivey et al. |
| 2010/0019689 A1 | 1/2010 | Shan |
| 2010/0027259 A1 | 2/2010 | Simon et al. |
| 2010/0033095 A1 | 2/2010 | Sadwick |
| 2010/0033964 A1 | 2/2010 | Choi et al. |
| 2010/0096992 A1 | 4/2010 | Yamamoto et al. |
| 2010/0096998 A1 | 4/2010 | Beers |
| 2010/0103664 A1 | 4/2010 | Simon et al. |
| 2010/0109550 A1 | 5/2010 | Huda et al. |
| 2010/0109558 A1 | 5/2010 | Chew |
| 2010/0164404 A1 | 7/2010 | Shao et al. |
| 2011/0109454 A1 | 5/2011 | McSheffrey, Sr. et al. |

FOREIGN PATENT DOCUMENTS

| | | |
|---|---|---|
| CN | 2869556 Y | 2/2007 |
| EP | 0013782 B1 | 3/1983 |
| EP | 0091172 A2 | 10/1983 |
| EP | 0124924 B1 | 9/1987 |
| EP | 0174699 B1 | 11/1988 |
| EP | 0197602 B1 | 11/1990 |
| EP | 0214701 B1 | 3/1992 |
| EP | 0262713 B1 | 6/1992 |
| EP | 0203668 B1 | 2/1993 |
| EP | 0272749 B1 | 8/1993 |
| EP | 0337567 B1 | 11/1993 |
| EP | 0390262 B1 | 12/1993 |
| EP | 0359329 B1 | 3/1994 |
| EP | 0403011 B1 | 4/1994 |
| EP | 0632511 A2 | 1/1995 |
| EP | 0432848 B1 | 4/1995 |
| EP | 0403001 B1 | 8/1995 |
| EP | 0525876 B1 | 5/1996 |
| EP | 0714556 B1 | 1/1999 |
| EP | 0458408 B1 | 9/1999 |
| EP | 0578302 B1 | 9/1999 |
| EP | 0723701 B1 | 1/2000 |
| EP | 0787419 B1 | 5/2001 |
| EP | 1195740 A2 | 4/2002 |
| EP | 1016062 B1 | 8/2002 |
| EP | 1195740 A3 | 1/2003 |
| EP | 1149510 B1 | 2/2003 |
| EP | 1056993 B1 | 3/2003 |
| EP | 0766436 B1 | 5/2003 |
| EP | 0924281 B1 | 5/2003 |
| EP | 0826167 B1 | 6/2003 |
| EP | 1147686 B1 | 1/2004 |
| EP | 1142452 B1 | 3/2004 |
| EP | 1145602 B1 | 3/2004 |
| EP | 1422975 A1 | 5/2004 |
| EP | 0890059 B1 | 6/2004 |
| EP | 1348319 B1 | 6/2005 |
| EP | 1037862 B1 | 7/2005 |
| EP | 1346609 B1 | 8/2005 |
| EP | 1321012 B1 | 12/2005 |
| EP | 1610593 A2 | 12/2005 |
| EP | 1624728 A1 | 2/2006 |
| EP | 1415517 B1 | 5/2006 |
| EP | 1415518 B1 | 5/2006 |
| EP | 1438877 B1 | 5/2006 |
| EP | 1166604 B1 | 6/2006 |
| EP | 1479270 B1 | 7/2006 |
| EP | 1348318 B1 | 8/2006 |
| EP | 1399694 B1 | 8/2006 |
| EP | 1461980 B1 | 10/2006 |
| EP | 1110120 B1 | 4/2007 |
| EP | 1440604 B1 | 4/2007 |
| EP | 1047903 B1 | 6/2007 |
| EP | 1500307 B1 | 6/2007 |
| EP | 0922305 B1 | 8/2007 |
| EP | 0922306 B1 | 8/2007 |
| EP | 1194918 B1 | 8/2007 |
| EP | 1048085 B1 | 11/2007 |
| EP | 1763650 B1 | 12/2007 |
| EP | 1776722 B1 | 1/2008 |
| EP | 1459599 B1 | 2/2008 |
| EP | 1887836 A2 | 2/2008 |
| EP | 1579733 B1 | 4/2008 |
| EP | 1145282 B1 | 7/2008 |
| EP | 1157428 B1 | 9/2008 |

(56) References Cited

FOREIGN PATENT DOCUMENTS

| | | |
|---|---|---|
| EP | 1000522 B1 | 12/2008 |
| EP | 1502483 B1 | 12/2008 |
| EP | 1576858 B1 | 12/2008 |
| EP | 1646092 B1 | 1/2009 |
| EP | 1579736 B1 | 2/2009 |
| EP | 1889519 B1 | 3/2009 |
| EP | 1537354 B1 | 4/2009 |
| EP | 1518445 B1 | 5/2009 |
| EP | 1337784 B1 | 6/2009 |
| EP | 2013530 B1 | 8/2009 |
| EP | 1461982 B1 | 9/2009 |
| GB | 2215024 A | 9/1989 |
| GB | 2324901 A | 11/1998 |
| JP | 06-054289 | 2/1994 |
| JP | 6-54103 U | 7/1994 |
| JP | 08-162677 | 7/1994 |
| JP | 7-249467 | 9/1995 |
| JP | 7264036 | 10/1995 |
| JP | 11-135274 A | 5/1999 |
| JP | 2001-238272 A | 8/2001 |
| JP | 2002-141555 A | 5/2002 |
| JP | 3098271 U | 2/2004 |
| JP | 2004119078 A | 4/2004 |
| JP | 2004-335426 | 11/2004 |
| JP | 2005-158363 A | 6/2005 |
| JP | 2005-166617 A | 6/2005 |
| JP | 2005-347214 A | 12/2005 |
| JP | 2006-507641 A | 3/2006 |
| JP | 3139714 U | 2/2008 |
| JP | 2008186758 A | 8/2008 |
| JP | 2008-258124 A | 10/2008 |
| JP | 2008293753 A | 12/2008 |
| KR | 10-2004-0008244 A | 1/2004 |
| KR | 20-0430022 Y1 | 11/2006 |
| KR | 10-0781652 B1 | 12/2007 |
| KR | 100844538 B1 | 7/2008 |
| KR | 100888669 B1 | 3/2009 |
| TW | M337036 | 7/2008 |
| WO | 9906759 A1 | 2/1999 |
| WO | 99/10867 A1 | 3/1999 |
| WO | 99/31560 A2 | 6/1999 |
| WO | 9945312 A1 | 9/1999 |
| WO | 00/01067 A2 | 1/2000 |
| WO | 2006056120 A1 | 1/2001 |
| WO | 02/25842 A2 | 3/2002 |
| WO | 02/061330 A2 | 8/2002 |
| WO | 02/069306 A2 | 9/2002 |
| WO | 02/091805 A2 | 11/2002 |
| WO | 02/098182 A2 | 12/2002 |
| WO | 02/099780 A2 | 12/2002 |
| WO | 03/026358 A1 | 3/2003 |
| WO | 03/055273 A2 | 7/2003 |
| WO | 03/067934 A2 | 8/2003 |
| WO | 03/090890 A1 | 11/2003 |
| WO | 03/096761 A1 | 11/2003 |
| WO | 2004/021747 A2 | 3/2004 |
| WO | 2004/023850 A2 | 3/2004 |
| WO | 2004/032572 A2 | 4/2004 |
| WO | 2004057924 A1 | 7/2004 |
| WO | 2004/100624 A2 | 11/2004 |
| WO | 2005031860 A2 | 4/2005 |
| WO | 2005/052751 A2 | 6/2005 |
| WO | 2005/060309 A2 | 6/2005 |
| WO | 2005/084339 A2 | 9/2005 |
| WO | 2005/089293 A2 | 9/2005 |
| WO | 2005/089309 A2 | 9/2005 |
| WO | 2006/023149 A2 | 3/2006 |
| WO | 2006044328 A1 | 4/2006 |
| WO | 2006/093889 A2 | 9/2006 |
| WO | 2006/127666 A2 | 11/2006 |
| WO | 2006/127785 A2 | 11/2006 |
| WO | 2006/133272 A2 | 12/2006 |
| WO | 2006137686 A1 | 12/2006 |
| WO | 2007/081674 A1 | 7/2007 |
| WO | 2007/094810 A2 | 8/2007 |
| WO | 2007090292 A1 | 8/2007 |
| WO | 2008137460 A2 | 11/2008 |
| WO | 9957945 A1 | 9/2009 |
| WO | 2010014437 A2 | 2/2010 |
| WO | 2010/030509 A2 | 3/2010 |

OTHER PUBLICATIONS

Experiment Electronic Ballast. Electronic Ballast for Fluorescent Lamps [online], Revised Fall of 2007. [Retrieved on Sep. 1, 1997]. Retrieved from Virginia Tech Web Page using Internet <URL: http://www.ece.vt.edu/ece3354/labs/ballast.pdf.>.

Truck-Lite, LEDSelect—LED, Model 35, Clearance & Marker Lighting, [online], [retrieved on Jan. 13, 2000] Retrieved from Truck-Lite Web Page using Internet <URL: http://trucklite.com/leds14.html>.

Truck-Lite, LEDSelect—LED, Super 44, Stop, Turn & Tail Lighting, [online], [retrieved on Jan. 13, 2000] Retrieved from Truck-Lite Web Page using Internet <URL: http://trucklite.com/leds2.html>.

Truck-Lite, LEDSelect—LED, Model 45, Stop, Turn & Tail Lighting [online], [retrieved on Jan. 13, 2000] Retrieved from Truck-Lite Web Page using Internet <URL: http://trucklite.com/leds4.html>.

Telecite Products & Services—Display Options, [online], [retrieved on Jan. 13, 2000] Retrieved from Telecite Web page using Internet <URL: http://www.telecite.com/en/products/options en.htm>.

Traffic Signal Products—Transportation Products Group, [online], [retrieved on Jan. 13, 2000] Retrieved from the Dialight Web Page using Internet <URL: http://www.dialight.com/trans.htm>.

LED Lights, Replacement LED lamps for any incandescent light, [online], [retrieved on Jan. 13, 2000] Retrieved from LED Lights Web Page using Internet <URL: http://www.ledlights.com/replac.htm>.

LEDtronics, LEDtronics Catalog, 1996, p. 10, LEDtronics, Torrance, California.

Piper. The Best Path to Efficiency. Building Operating Management, Trade Press Publishing Company May 2000 [online], [retrieved on Jan. 17, 2008]. Retrieved from Find Articles Web Page using Internet <URL:http://findarticles.com/p/articles/mi_qu3922/is_200005/ai_n8899499/>.

Henson, Keith. The Benefits of Building Systems Integration, Access Control & Security Systems Integration, Oct. 1, 2000, Penton Media. [online], [retrieved on Oct. 24, 2008] Retrieved from Security Solutions Web page using Internet <URL: http://securitysolutions.com/mag/security_benefits_building_systems/>.

Phason Electronic Control Systems, Light Level Controller (LLC) case study. Nov. 30, 2004. 3 pages, Phason Inc., Winnipeg, Manitoba, Canada.

Airport International. Fly High With Intelligent Airport Building and Security Solutions [online], [retrieved on Oct. 24, 2008]. Retrieved from Airport International web page using Internet <URL: http://www.airport-int.com/categories/airport-building-and-security-solutions/fly-high-with-intelligent-airport-building-and-security-solutions.html>.

D.N.A.-III, [online], [retrieved Mar. 10, 2009] Retrieved from the PLC Lighting Web Page using Internet <URL: http://www.plclighting.com/product_info.php?cPath=1&products_id=92>.

E20116-18 Larmes Collection, [online], [retrieved on Jul. 10, 2010] Retrieved from ET2 Contemporary Lighting using Internet <URL: http://www.et2online.com/proddetail.aspx?ItemID=E20116-18>.

E20112-22 Starburst Collection, [online], [retrieved on Jul. 10, 2010] Retrieved from ET2 Contemporary Lighting using Internet <URL: http://www.et2online.com/proddetail.aspx?ItemID=E20112-22>.

E20524-10 & E20525-10 Curva Collection, [online], [retrieved on Jul. 10, 2010] Retrieved from ET2 Contemporary Lighting using Internet <URL: http://www.et2online.com/proddetail.aspx?ItemID=E20524-10 & E20525-10>.

E22201-44 Esprit Collection, [online], [retrieved on Jul. 10, 2010] Retrieved from ET2 Contemporary Lighting using Internet <URL: http://www.et2online.com/proddetail.aspx?ItemID=E22201-44>.

E20743-09 Stealth Collection, [online], [retrieved on Jul. 10, 2010] Retrieved from ET2 Contemporary Lighting using Internet <URL: http://www.et2online.com/proddetail.aspx?ItemID=E20743-09>.

Spencer, Eugene. High Sales, Low Utilization. Green Intelligent Buildings, Feb. 1, 2007. [online]. Retrieved from Green Intelligent

(56) References Cited

OTHER PUBLICATIONS

Buildings web page using Internet <URL: http://www.greenintelligentbuildings.com/CDA/IBT_Archive/BNP_GUID_9-5-2006_A_10000000000000056772>.
Sensor Switch, nLight Lighting Control System, [online], [retrieved on Jan. 11, 2008] Retrieved from Sensor Switch web page using Internet <URL: http://www.sensorswitch.com>.
Six Strategies, [online], [retrieved on Jan. 11, 2008] Retrieved from Encelium Technologies Inc. Web Page using Internet <URL: http://www.encelium.com/products/strategies.html>.
Lawrence Berkeley National Labratory. Lighting Control System—Phase Cut Carrier. University of California, [online] [retrieved on Jan. 14, 2008] Retrieved from Lawrence Berkeley National Labratory web page using Internet <URL: http://www.lbl.gov/tt/techs/lbnl1871.html>.
Best Practice Guide—Commercial Office Buildings—Central HVAC System. [online], [Retrieved on Jan. 17, 2008] Retrieved from Flex Your Power Organization web page using Internet <URL: http://www.fypower.org/bpg/module.html?b=offices&m+Central HVAC Systems&s=Contr . . . >.
Cornell University. Light Canopy—Cornell University Solar Decathlon, [online], [retrieved on Jan. 17, 2008] Retrieved from Cornell University web page using Internet <URL: http://cusd.cornell.edu/cusd/web/index.php/page/show/section/Design/page/controls>.
PLC-96973-PC PLC Lighting Elegance Modern/Contemporary Pendant Light, [online], [retrieved on Feb. 27, 2009] Retrieved from the Arcadian Lighting Web Page using Internet <URL: http/www.arcadianlighting.com/plc-96978-pc.html>.
PLC-81756-AL "Fireball" Contemporary Pendant Light, [online], [retrieved on Feb. 27, 2009] Retrieved from the Arcadian Lighting Web Page using Internet <URL: http://www.arcadianlighting.com/plc-81756-al.html>.
Philips. Sense and Simplicity—Licensing program for LED Luminaires and Retrofits, Philips Intellectual Property & Standards, May 5, 2009.
International Search Report and Written Opinion dated Jul. 17, 2009 from the corresponding International Application No. PCT/US2008/085118 filed Dec. 1, 2008.
International Search Report and Written Opinion dated Aug. 25, 2009 from corresponding International Application No. PCT/US2009/031049 filed Jan. 15, 2009.
International Search Report and Written Opinion dated Jan. 4, 2010 from the corresponding International Application No. PCT/US2009/044313 filed May 18, 2009.
International Search Report and Written Opinion dated Jan. 25, 2010 from the corresponding International Application No. PCT/US2009/048623 filed Jun. 25, 2009.
International Search Report and Written Opinion dated Feb. 26, 2010 from the corresponding International Application No. PCT/US2009/050949 filed Jul. 17, 2009.
International Search Report and Written Opinion dated Mar. 22, 2010 from the corresponding International Application No. PCT/US2009/053853 filed Aug. 14, 2009.
International Search Report and Written Opinion dated May 2010 from the corresponding International Application No. PCT/US2009/060085 filed Oct. 9, 2009.
International Search Report and Written Opinion dated May 24, 2010 from the corresponding International Application No. PCT/US2009/060087 filed Oct. 9, 2009.
International Search Report and Written Opinion dated May 24, 2010 from the corresponding International Application No. PCT/2009/060083 filed Oct. 9, 2009.
International Search Report and Written Opinion dated Jul. 16, 2009 from the corresponding International Application No. PCT/US2008/084650 filed Nov. 25, 2008.
International Search Report and Written Opinion dated Feb. 8, 2011 from the corresponding International Application No. PCT/US2010/039608 filed Jun. 23, 2010.
International Search Report and Written Opinion dated Dec. 24, 2010 from the corresponding International Application No. PCT/US2010/034635 filed May 13, 2010.
International Search Report and Written Opinion dated Feb. 7, 2011 from the corresponding International Application No. PCT/US2010/039678 filed Jun. 23, 2010.
International Search Report and Written Opinion dated Dec. 13, 2010 from the corresponding International Application No. PCT/US2010/037006 filed Jun. 2, 2010.
LCD Optics 101 Tutorial [online]. 3M Corporation, [retrieved on Jan. 6, 2010]. Retrieved from the internet: <URL: http://solutions.3m.com/wps/portal/3M/en_US/Vikuiti1/BrandProducts/secondary/optics101/>.
International Search Report and Written Opinion dated Jul. 30, 2010 from the corresponding International Application No. PCT/US2010/021448 filed on Jan. 20, 2010.
International Search Report and Written Opinion dated Aug. 16, 2010 from the corresponding International Application No. PCT/US2010/021131 filed on Jan. 15, 2010.
International Search Report and Written Opinion dated May 7, 2010 from the corresponding International Application No. PCT/US2009/057109 filed on Sep. 16, 2009.
International Search Report and Written Opinion dated Apr. 30, 2010 from the corresponding International Application No. PCT/US2009/057072 filed on Sep. 16, 2009.
International Search Report and Written Opinion dated Aug. 17, 2010 from the corresponding International Application No. PCT/US2010/021489 filed on Jan. 20, 2010.
International Search Report and Written Opinion dated Apr. 8, 2010 from the corresponding International Application No. PCT/2009/055114 filed on Aug. 27, 2009.
Notification of Transmittal, International Search Report and the Written Opinion of the International Searching Authority dated Sep. 30, 2011, from the corresponding International Application No. PCT/US2011/029905 filed Mar. 25, 2011.
Extended European Search Report for co-pending European Application No. 11 760 276 mailed on Oct. 10, 2013 in 6 pages.

\* cited by examiner

LED LIGHT TUBE WITH DUAL SIDED LIGHT DISTRIBUTION

CROSS REFERENCE TO RELATED APPLICATIONS

This application claims priority to Provisional Application No. 61/317,825 filed Mar. 26, 2010, which is hereby incorporated by reference in its entirety.

TECHNICAL FIELD

The invention relates to a light emitting diode (LED) based light tube usable in a fluorescent light fixture in place of a conventional fluorescent tube.

BACKGROUND

Fluorescent tubes are widely used in a variety of locations such as schools and office buildings for providing area lighting, for example. A fluorescent tube typically produces an even distribution of light about its circumference. However, the circumferentially uniform light produced by typical fluorescent tubes may be modified after exiting the tube such that the light distribution becomes directional with a greater amount of light directed in a first radial direction compared to a second radial direction.

Consider the example of a fluorescent light fixture installed in a ceiling. The light produced by a fluorescent tube installed in such a fixture is typically intended to illuminate an area below the ceiling. A reflector is often positioned above the fluorescent tube to redirect upward traveling light toward the area below the ceiling to be illuminated. The reflector can in effect increase the efficiency of the fluorescent tube by redirecting light that would otherwise illuminate an area where illumination provides limited or no benefit, such as a portion of the ceiling above the fluorescent tube in the present example, toward an area where illumination provides a greater benefit. Reflectors used to make light produced by fluorescent tubes directional are present in many existing fluorescent tube fixtures.

LED-based light tubes have been developed for use in fluorescent light fixtures to replace conventional fluorescent tubes. LED-based light tubes, by definition, each include one or more LEDs. LEDs output light directionally, typically in a Lambertian distribution. A typical LED-based tube is constructed with its LEDs arranged to face in a common direction. As such, the typical LED-based tube should be installed in a fixture in a specific orientation, specifically with its LED oriented to produce light toward an area to be illuminated. For example, when installed in a fixture in a ceiling that has a reflector as described above, the typical LED-based tube is installed to be oriented such that its LEDs face away from the reflector. Due to the orientation of the typical LED-based tube and the directional output of the typical LED-based tube when installed in the ceiling fixture, a large portion of produced light travels directly toward an area below the ceiling that is intended to be illuminated, and thus a typical LED-based tube produces minimal amounts of light in the direction toward the reflector. As a result, the reflectors attached to many fluorescent light fixtures serve little purpose when typical LED-based tubes are installed in the fixtures.

BRIEF SUMMARY

While the typical LED-based light tube installed in a fluorescent fixture has its LEDs oriented in a common direction facing an area to be illuminated, the resulting light distribution towards the area to be illuminated may not be as uniform as the light distribution produced by a fluorescent tube. That is, the Lambertian distribution of light from the typical LED-based tube results in a bright area directly inline with the direction the LEDs face, while areas lateral of the bright area are typically illuminated to a lesser extent, if at all.

Examples of LED-based light tubes with dual-sided light distributions as described herein can produce a more uniform distribution of light when installed in fluorescent fixtures having reflectors compared to known LED-based tubes. LED-based tubes with dual-sided light distributions can produce light in a first direction toward an area to be illuminated and can also produce light in a second direction different from the first direction. The second direction can be generally opposite the first direction. The amount of light produced toward the first direction can be, but need not necessarily be, greater than the amount of light produced toward the second direction. As a result, when installed in a fluorescent fixture that has a reflector, light produced toward the first direction can travel directly toward an area to be illuminated without being reflected or otherwise re-directed once exiting the LED-based tube. Light produced toward the second direction, however, can be reflected by the reflector and re-directed toward the area to be illuminated. The light produced toward the second direction can thus be spread out prior to reaching the area to be illuminated, thus increasing the uniformity of the distribution of light emanating from the tube. The combination of the light produced in the first direction traveling directly toward the area to be illuminated and the light produced in the second direction that is re-directed by the reflector can provide an improved distribution of light compared to known LED-based lights.

One embodiment disclosed herein of an LED light for use in a fluorescent light fixture comprises a housing and a circuit board having a first surface configured to face an illumination area, the circuit board mounted in the housing and defining a plane conceptually dividing the housing into a first portion and a second portion. At least one LED is mounted on the first surface of the circuit board and is configured to emanate light in a first direction. Light distribution means is configured to distribute a portion of the light emanated in the first direction to at least a second direction different than the first direction.

Another embodiment of an LED light for use in a fluorescent light fixture comprises a housing and a circuit board having a first surface configured to face an illumination area, the circuit board mounted in the housing and defining a plane conceptually dividing the housing into a first portion and a second portion. A plurality of LEDs is mounted on the first surface of the circuit board and is configured to emanate light in a first direction through the first portion of the housing. Apertures in the circuit board are configured to pass light reflected by the first portion of the housing in at least a second direction through the second portion of the housing.

Yet another embodiment of an LED light for use in a fluorescent light fixture comprises a housing and a circuit board having a first surface configured to face an illumination area and an opposing second surface. A first plurality of LEDs is mounted on the first surface of the circuit board and configured to emanate light in a first direction through the first portion of the housing. A second plurality of LEDs is mounted on the second surface of the circuit board and configured to emanate light in a second direction through the second portion of the housing.

Also disclosed herein are methods of distributing light in a plurality of directions from an LED-based light. One such method of distributing light in more than one direction from an LED light for use in a fluorescent light fixture comprises emanating light in a first direction from at least one LED positioned on a circuit board facing an illumination area, deflecting a portion of the light emanated in the first direction in a second direction with a portion of a housing, passing the portion of the light emanated in the second direction through apertures in the circuit board and reflecting light back toward the illumination area with the reflector.

BRIEF DESCRIPTION OF THE DRAWINGS

The description herein makes reference to the accompanying drawings wherein like reference numerals refer to like parts throughout the several views, and wherein.

DETAILED DESCRIPTION

Figure 1:
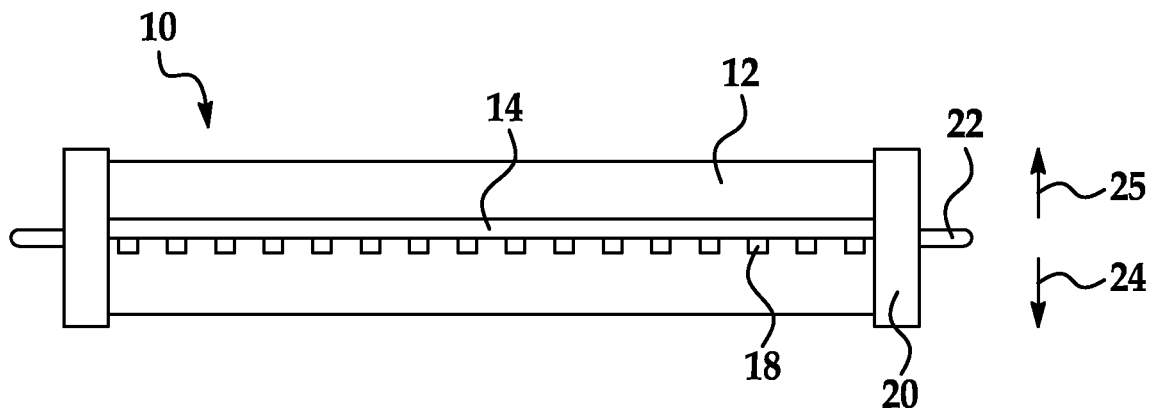
FIG. 1 is a side view of a first example of an LED-based light tube with dual-sided light distribution.

FIGS. 1-9 illustrate examples of LED-based lights having dual-sided distributions. In the example illustrated in FIGS. 1-3, an LED-based light tube 10 is configured as a replacement for a fluorescent tube in a fluorescent fixture. The light tube 10 includes a housing 12, a circuit board 14 in the housing 12 that defines a plurality of apertures 16, one or more LEDs 18 mounted on the circuit board 14, and a pair of end caps 20 attached at opposing ends of the housing 12. The light tube 10 can additionally include other components, such as electrical components or one or more highly thermally conductive structures for enhancing heat dissipation.

Figure 2:
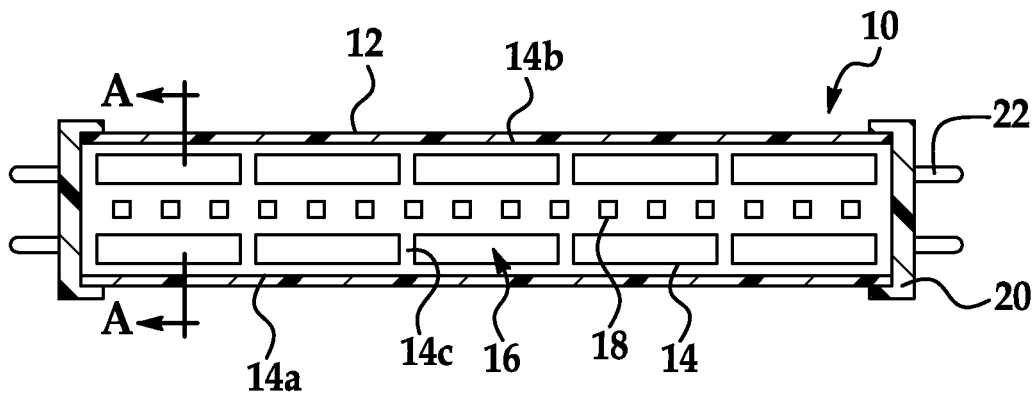
FIG. 2 is a bottom plan view of the LED-based light tube with dual-sided light distribution of FIG. 1.
Figure 3:
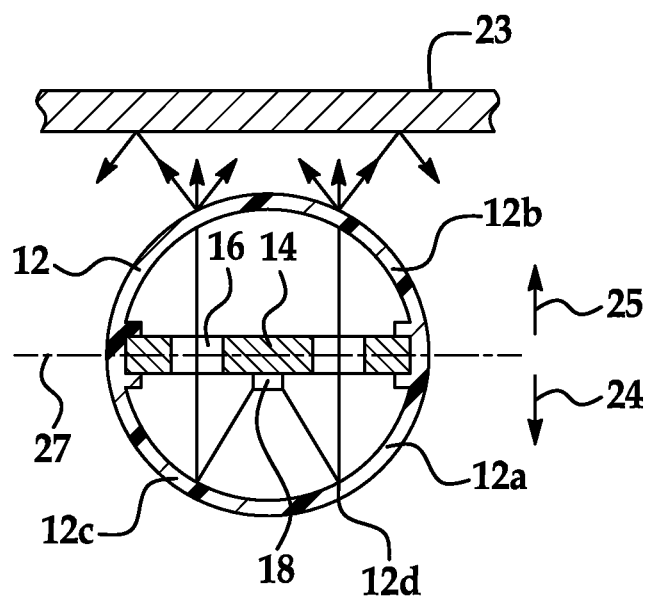
FIG. 3 is a cross section view of the LED-based light tube of FIG. 2 along line A-A.

The housing 12 as shown in FIGS. 1-3 is a light transmitting cylindrical tube. The housing 12 can be made from polycarbonate, acrylic, glass or another light transmitting material. The housing 12 can be transparent or translucent. For example, a translucent housing 12 can be made from a composite, such as polycarbonate with particles of a light refracting material interspersed in the polycarbonate. While the illustrated housing 12 is cylindrical, the housing 12 can alternatively have a square, triangular, polygonal, or other cross sectional shape. Similarly, while the illustrated housing 12 is linear, the housing 12 can have an alternative shape, e.g., a U-shape or a circular shape. Additionally, the housing 12 need not be a single piece as shown in FIGS. 1 and 2. Instead, the housing 12 can be formed by connecting multiple individual parts, not all of which need be light transmitting. The housing 12 can have a length such that the light 10 is approximately 48" long, and the housing 12 can have a 0.625", 1.0", or 1.5" diameter for engagement with common fluorescent fixtures. The housing 12 can be manufactured to include light diffusing or refracting properties, such as by surface roughening or applying a diffusing film to the housing 12.

While the illustrated circuit board 14 is shown as an integral circuit board, multiple circuit board sections can be joined by bridge connectors to create the circuit board 14. The circuit board 14 as shown in FIGS. 1-3 can be slidably engaged with the housing 12, though the circuit board 14 can alternatively be clipped, adhered, snap- or friction-fit, screwed or otherwise connected to the housing 12. Also, other types of circuit boards may be used, such as a metal core circuit board.

The end caps 20 can be attached at opposing longitudinal ends of the housing 12 for physically and electrically connecting the bulb 10 to a fixture. The end caps 20 can be the sole physical connection between the bulb 10 and fixture. The end caps 20 can be electrically connected to the circuit board 14 for providing power to the LEDs 18. Each end cap 20 is illustrated with two pins 22, though two of the total four pins can be "dummy pins" that do not provide an electrical connection. Alternatively, other types of electrical connectors can be used, such as an end cap carrying a single pin. Also, while the end caps 20 are shown as including cup-shaped bodies, the end caps 20 can have a different configuration, for example, the end caps 20 can be shaped to be press fit into the housing 12. One or both of the end caps 20 can additionally include electric components, such as a rectifier and filter.

The LEDs 18 can be surface-mount devices of a type available from Nichia, though other types of LEDs can alternatively be used. For example, although surface-mounted LEDs 18 are shown, one or more organic LEDs can be used in place of or in addition thereto. Each LED 18 can include a single diode or multiple diodes, such as a package of diodes producing light that appears to an ordinary observer as coming from a single source. The LEDs 18 can emit white light. However, LEDs that emit blue light, ultra-violet light or other wavelengths of light can be used in place of white light emitting LEDs 18. The number of LEDs 18 can be a function of the desired power of the light tube 10 and the power of the LEDs 18. For a 48" light, such as the illustrated tube 10, the number of LEDs 18 can vary from about five to four hundred such that the tube 10 outputs approximately 500 to 3,000 lumens. However, a different number of LEDs 18 can alternatively be used, and the light tube 10 can output another amount of lumens. The LEDs 18 can be evenly spaced along the circuit board 16, and the spacing of the LEDs 18 can be determined based on, for example, the light distribution of each LED 18 and the number of LEDs 18.

The light tube 10 of FIGS. 1-3 can be installed in a fluorescent fixture by engaging the end caps 20 with the fixture with the circuit board 14 and LEDs 18 oriented to face the area to be illuminated. When installed in a fluorescent fixture with a reflector and energized, the light tube 10 produces a first flux of light in a first direction 24 toward an area to be illuminated, for example, an area directly below the fixture and its surrounding area when the fixture is in a ceiling. Additionally, the light tube 10 produces a second flux of light in a second direction 25 generally opposite the first direction 24. The first flux of light can be greater than the second flux of light, though it need not necessarily be (e.g., the two fluxes of light can be generally equal). The reflector, such as a mirror or a piece of plastic, ceiling or other material having a reflective coating, is typically on an opposing side of the light tube 10 from the area to be illuminated, such as above the light tube 10 when the fixture is on a ceiling. The reflector is represented as numeral 23 in FIG. 3. The reflector 23 is typically configured to reflect light in the first direction 24 toward the area to be illuminated. The second flux of light is produced by deflection of the housing 12 in a direction toward the reflector 23. The reflector 23, in turn, can redirect the second flux of light toward the area to be illuminated. That is, when installed in a fixture including a reflector 23, the light tube 10 produces the first flux of light directly toward the area to be illuminated and produces the second flux of light indirectly toward the area to be illuminated via the reflector 23. The reflector 23 can spread out the second flux of light such that the light tube 10 produces a similar distribution of light to a fluorescent tube when installed in the fixture. As a result, the LED-based light tube 10 can provide a more even distribution of light than an LED-based light tube that produces light in a single direction when installed in the fixture including the reflector 23.

Referring now to FIG. 3, a plane 27 defined by the circuit board 14 can conceptually divide the housing 12 into a first half 12a and a second half 12b, and the first and second halves 12a and 12b can have different light diffusing and/or refracting properties (e.g., different amounts of surface roughening can be provided on the halves 12a and 12b, or different types of diffusing film can be applied to the halves 12a and 12b). The first half 12a can be configured to diffuse and/or deflect light to a greater extent than the second half 12b, and the amount of diffusion and/or deflection provided by the first half 12a can affect the amount of light produced in the first direction 24 compared to the second direction 25. That is, increasing the diffusing and/or deflection properties of the first half 12a can cause a greater amount of light to be internally deflected by the first half 12a, and light internally deflected by the first half 12a can be provided in the second direction 25. Further, providing different light diffusing and/or deflecting properties on the first and second halves 12a and 12b of the housing 12 can allow for diffusing or otherwise spreading light traveling in the first direction 24 by a different amount than light traveling in the second direction 25. For example, the first half 12a can diffract and/or diffuse light to a greater extent than the second half 12b to reduce the directional appearance of light traveling in the first direction 24, which can exit the housing 12 traveling in the direction 24 directly toward the area to be illuminated and thus more easily visible from a point of view of an observer in the area to be illuminated. The second half 12b can diffuse and/or refract light to a lesser extent than the first half 12a, as this can enhance the amount of light that exits through the second half 12b of the housing 12 without being internally reflected.

Further, the light diffusing and/or deflecting properties of the housing 12 can vary about the circumference of the each tube half 12a and 12b. For example, the tube half 12a can be configured to provide greater light diffusion or deflection over an area normal to the circuit board 14 and inline with the LEDs 18 compared to an area circumferentially spaced therefrom by, as an example, providing greater surface roughening over the portion of the half 12a normal to the circuit board and inline with the LEDs 18 compared to the circumferentially spaced area.

As another example, one or more areas, such as deflecting areas 12c and 12d as shown in FIG. 2, can be treated differently from other portions of the housing 12 to direct light from the LEDs 18 toward apertures 16 in the circuit board 14. The apertures 16 allow light reflected by the first half 12a of the housing 12 toward the circuit board 14 to pass the circuit board 14. The areas 12c and 12d can be treated to increase their light diffusing and/or refracting properties compared to a remainder of the half 12a such that the areas 12c and 12d internally reflect a large portion of light. This can be accomplished by, as examples, increasing an amount of surface roughening on the areas 12c and 12d compared to the rest of the half 12a, applying different diffusing film to areas 12c and 12d than a remainder of half 12a, or attaching one or more reflectors to the housing 12 over at least portions of the areas 12c and 12d. The size and location of areas 12c and 12d and their properties can be selected to control the amount of light produced by the LEDs 18 that is directed through the apertures 16 defined by the circuit board 14, and thus in the second direction 25. For example, covering areas 12c and 12d with reflectors can provide a greater flux of light in the second direction 25 compared to roughening the surfaces of areas 12c and 12d. Additionally, the areas 12c and 12d need not necessarily have different properties from a remainder of the first half 12a of the housing 12, nor need the first half 12a necessarily have different properties than the second half 12b. Alternatively, instead of two areas 12c and 12d configured to internally reflect light, one or more than two such areas can be included on the first half 12a of the housing 12, and the locations of such areas can vary from as shown in FIG. 2. For example, in another example, a light-reflecting area can be directly above and inline with the LEDs 18.

The circuit board 14 as illustrated in FIGS. 1-3 is an elongate printed circuit board defining the apertures 16 that allow light reflected by the first half 12a of the housing 12 toward the circuit board 14 to pass the circuit board 14. Such light can then exit the second half 12b of the housing in at least the second direction 25 toward the reflector 23. The sizes of the apertures 16 can be selected to control a ratio of fluxes of light directed in the first and second directions 24 and 25. For example, increasing the sizes of the apertures 16 can allow for more light to be directed toward the second direction 25. Additionally, the placement of the apertures 16 can also be affect the amount of light directed in the first direction 24 compared to the second direction 25. The exemplary circuit board 14 shown in FIGS. 2 and 3 defines apertures 16 inboard from longitudinal edges 14a and 14b of the circuit board 14, and the circuit board 14 includes transversely extending bridges 14c extending transversely between the apertures 16, which can strengthen the circuit board 14 and reduce the amount of light that passes the circuit board 14 toward the second half 12b. While the apertures 16 are shown as rectangular holes, the apertures 16 can alternatively be circular, oval, or some other shape.

Figure 4:
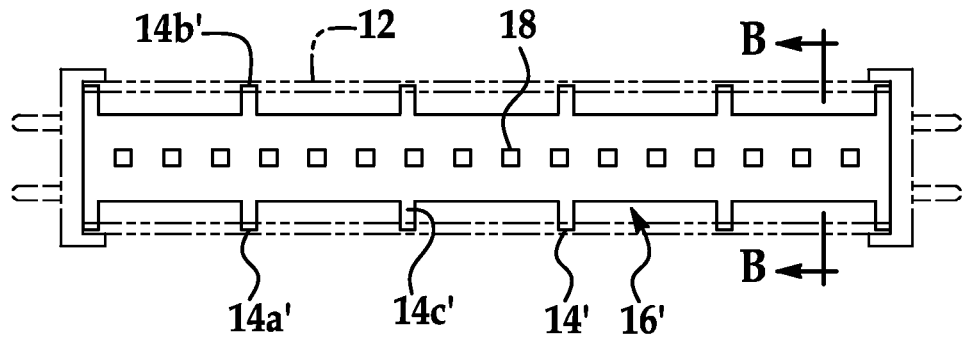
FIG. 4 is a top plan view of an example of a circuit board of another example of a LED-based light tube with dual-sided light distribution.

The apertures 16 can be located at different positions on the circuit board 14 than shown in FIGS. 2 and 3. For example, FIG. 4 shows another example of a circuit board 14' that can be placed in the housing 12 and engaged with end caps 20. The circuit board 14' can have apertures 16' formed out of longitudinal edges 14a' and 14b' of the circuit board 14'. Bridges 14c' extend transversely outward from the circuit board 14' between the apertures 16' for connection to the housing 12. As another example that is not illustrated, one or more apertures 16 can be formed along a longitudinal center line of the circuit board 14 between the LEDs. As still another example that is not illustrated, the circuit board 14 can have a width less than an inner radius of the housing 12, in which case the circuit board 14 can be secured in the housing 12 via attachment to the end caps 20, and gaps between the circuit board 14 and housing 12 can act as apertures 16.

The LEDs 18 can be mounted to the circuit board 14 at longitudinally spaced apart locations along a central portion of the circuit board 14 between the longitudinally spaced rows of apertures 16 as shown in FIG. 2. In other examples, however, the LEDs 18 can be mounted at other locations. For example, if apertures 16 occupy a central, longitudinally extending area of the circuit board 14, LEDs 18 can be mounted in two longitudinally extending rows on opposing sides of the apertures 16.

Figure 5:
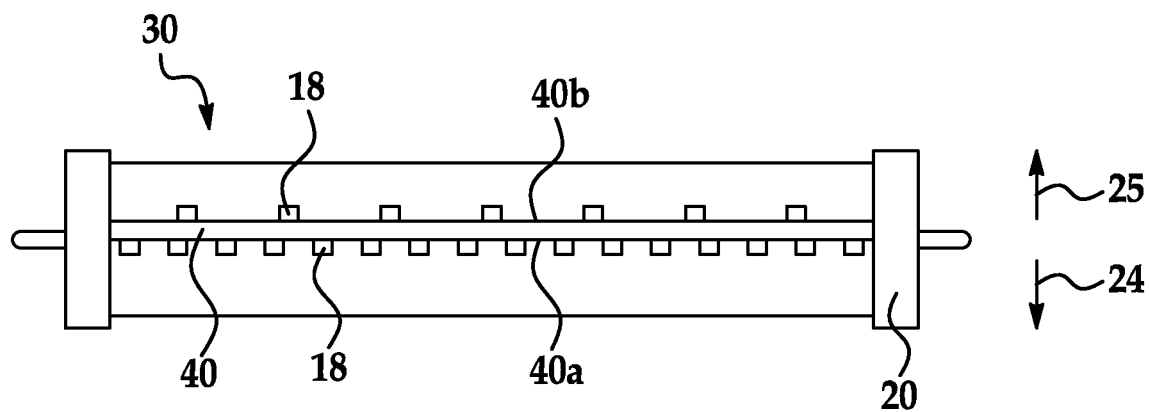
FIG. 5 is a side view of another example of an LED-based light tube with dual-sided light distribution.
Figure 6:
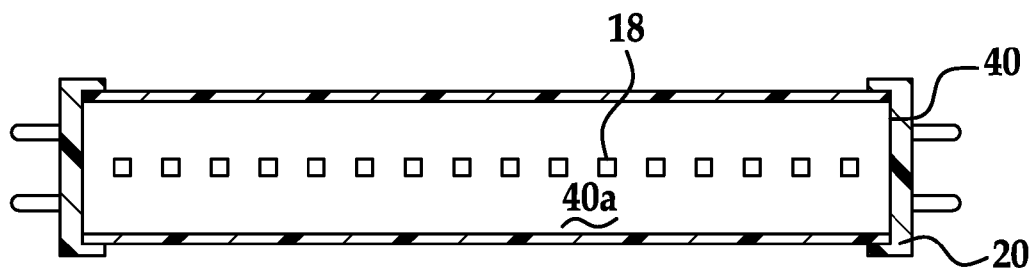
FIG. 6 is a bottom plan view the example of the LED-based light tube with dual-sided light distribution of FIG. 5.
Figure 7:
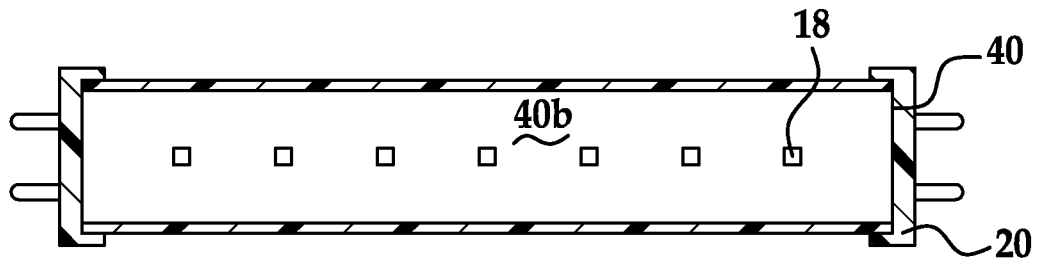
FIG. 7 is a top plan view of the LED-based light tube of FIG. 5.
Figure 8:
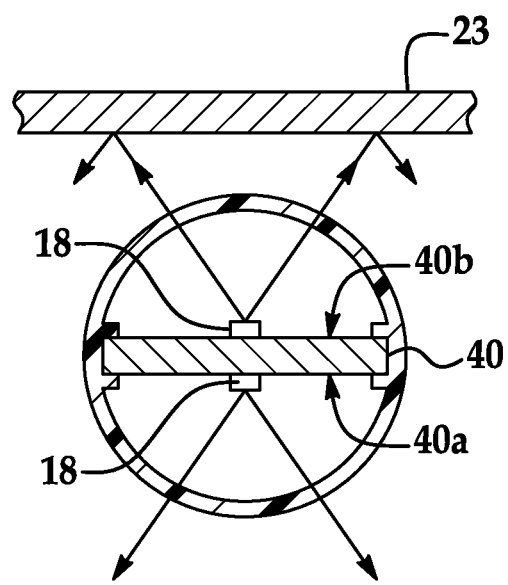
FIG. 8 is a cross section view of the LED-based light tube of FIG. 5 along line B-B.

Instead of relying on internally reflected light to produce light in the second direction 25, an LED-based light tube 30 shown in FIG. 5 has another example of a circuit board 40 that includes LEDs 18 mounted on a first side 40a of the circuit board 40 and a second side 40b opposite the first side 40a. The circuit board 40 can be installed in the housing 12 and engaged with end caps 20 similar to the circuit board 14. A greater number of LEDs 18 can be included on the first side 40a of the circuit board 40, shown in FIG. 6, than the number of LEDs included on the second side 40b, shown in FIG. 7, to provide more light directly to an area to be illuminated than indirectly to the area to be illuminated. Alternatively, the same number of LEDs 18 can be included on each side 40a, 40b. When installed in a fixture, the first side 40a can be oriented to face the first direction 24 toward the area to be illuminated and the second side 40b can face in the second direction 25 toward a reflector, as shown in FIG. 5. As such, light produced from the LEDs 18 on the second side 40b can be distributed by the reflector toward the area to be illuminated, allowing the light tube 30 in which the circuit board 40 is installed to provide an even distribution of light closely replicating a fluorescent tube. FIG. 8 is a cross section of the LED-based light tube 30 along line B-B and illustrates the location of the reflector 23 of the light fixture.

Figure 9:
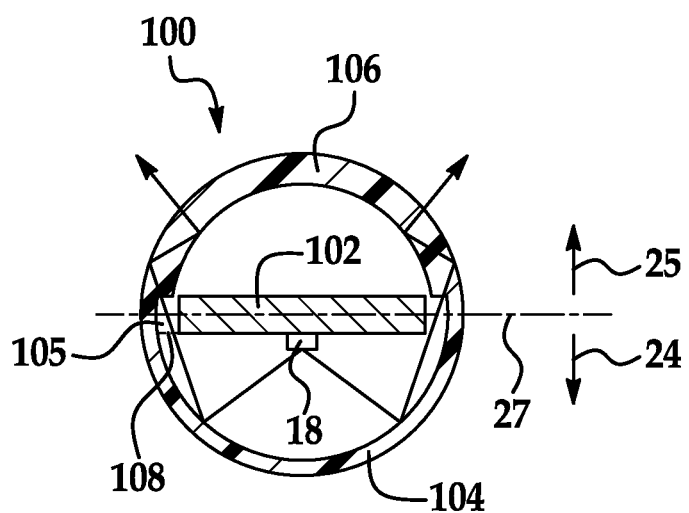
FIG. 9 is a cross section view of yet another example of an LED-based light with dual-sided light distribution taken along a plane perpendicular to a longitudinal axis of the light.

Another example of an LED light tube 100 capable of producing light in the first and second directions 24 and 25 is shown in cross section in FIG. 9. The tube 100 includes a circuit board 102 and a housing 104 as described with reference to the other figures. The circuit board 102 can define apertures 105 that allow light traveling in the first direction 24 and directed by the housing 104 toward the second direction 25 to pass the circuit board 102 in the second direction 25, similar to apertures 16 as described above. The apertures 105 can be radially between the circuit board 102 and the housing 104. For example, the circuit board 102 can have a width less than an interior diameter of the housing 104 and can be secured to end caps at opposing ends of the housing 104. Alternatively, the circuit board 105 can have an alternative shape defining apertures, such as a shape similar to the circuit board 14', in which case the apertures 105 can be between portions of the circuit board 105 similar to portions 14c' of circuit board 14', although the apertures 105 need not necessarily be radially outward of the circuit board 102.

The housing 104 can additionally include a light pipe portion 106. The light pipe portion 106 can include light inlets 108 aligned with the apertures 105. As a result, light produced by the LEDs 18 and directed by the housing 104 toward the apertures 105 can enter the light pipe 108. The light pipe 106 can guide light around a circumference of the housing 104, with light exiting the light pipe 106 at various circumferential locations. As a result, the light pipe 106 can allow light to exit the housing 104 and travel in the second direction 25, thereby facilitating a generally even distribution of light in the second direction 25. Light exiting the light pipe 106 can strike a reflector of a fixture in which the tube 100 is installed and can be reflected toward an area to be illuminated.

The above-described examples have been described in order to allow easy understanding of the invention and do not limit the invention. On the contrary, the invention is intended to cover various modifications and equivalent arrangements, whose scope is to be accorded the broadest interpretation so as to encompass all such modifications and equivalent structure as is permitted under the law.

We claim:

1. A method of distributing light in more than one direction from an LED light for use in a fluorescent light fixture having a reflector comprising:

emanating light in a first direction from at least one LED positioned on a circuit board facing an illumination area;

emitting a portion of the light emanated in the first direction from a housing at least partially enclosing the circuit board and the at least one LED through a first portion of the housing facing the at least one LED;

deflecting a portion of the light emanated in the first direction in a second direction with the first portion of the housing;

passing the deflected light through apertures in the circuit board that are in communication with a second portion of the housing;

emitting a portion of the passed light from the housing through the second portion of the housing; and reflecting the portion of the light emitted from the housing through the second portion of the housing back toward the illumination area with the reflector.

2. The method of claim 1 further comprising:

emitting at least some of the light deflected in the second direction through the apertures from a different portion of the housing.

3. The method of claim 1 further comprising:

installing an LED light in the fixture, the LED light comprising the housing and the circuit board.

4. The method of claim 1, wherein the housing comprises a tubular structure defining the first and second portions.

5. An LED light for use in a fluorescent light fixture comprising:

an generally flat elongate circuit board having a first side with a mounting surface and an opposing second side, and defining at least one aperture;

at least one LED on the mounting surface, the at least one LED configured to emanate light;

a housing for the circuit board, the housing having a tubular cross-sectional profile and laterally divided by the circuit board into a first circumferential portion defining a first lens surface facing the mounting surface and a second circumferential portion defining a second lens surface facing the second side, the first lens surface configured to emit a portion of the emanated light from the housing and deflect a portion of the emanated light to the second lens surface through the at least one aperture defined by the mounting surface, and the second lens surface configured to emit at least a portion of the deflected light from the housing; and at least one connector arranged at an end of the housing, the housing and the connector defining a package adapted for installation in a fluorescent light fixture.

6. The LED light of claim 5, wherein the first lens surface defines at least one deflecting area configured to deflect a portion of the emanated light to the second lens surface through the at least one aperture defined by the mounting surface.

7. The LED light of claim 6, wherein the at least one deflecting area is a reflector.

8. The LED light of claim 5, wherein the at least one aperture is located inboard from longitudinal edges of the circuit board.

9. The LED light of claim 5, wherein the at least one aperture is located along a center of the circuit board.

10. The LED light of claim 5, wherein the at least one aperture is a cut out along a longitudinal edge of the circuit board.

11. The LED light of claim 5, wherein the second lens surface includes a light pipe, the light pipe having at least one light inlet corresponding to the at least one aperture defined by the mounting surface to receive at least a portion of the deflected light for emission.

12. The LED light of claim 5, wherein the circuit board defines a plane conceptually dividing the housing into the first circumferential portion and the second circumferential portion.

13. The LED light of claim 5, wherein the first circumferential portion and the second circumferential portion approximately comprise respective halves of the circumference of the housing.

14. An LED-based replacement light comprising:
- an generally flat circuit board having a first side with a mounting surface and an opposing second side, and defining at least one aperture;
- at least one LED on the mounting surface, the at least one LED configured to emanate light;
- a housing for the circuit board and the at least one LED, the housing at least partially enclosing the circuit board and the at least one LED and defining a first lens surface spaced from and facing the mounting surface and a second lens surface spaced from and facing the second side, the first lens surface configured to emit a portion of the emanated light from the housing and deflect a portion of the emanated light to the second lens surface through the at least one aperture defined by the mounting surface, and the second lens surface configured to emit at least a portion of the deflected light from the housing; and
- at least one connector arranged at an end of the housing, the housing and the connector defining a package adapted for installation in a light fixture.

15. The LED light of claim 14, wherein the first lens surface defines at least one deflecting area configured to deflect a portion of the emanated light to the second lens surface through the at least one aperture defined by the mounting surface.

16. The LED light of claim 15, wherein the at least one deflecting area is a reflector.

17. The LED light of claim 14, wherein the at least one aperture is located inboard from longitudinal edges of the circuit board, is located along a center of the circuit board, or is a cut out along a longitudinal edge of the circuit board.

18. The LED light of claim 14, wherein the second lens surface includes a light pipe, the light pipe having at least one light inlet corresponding to the at least one aperture defined by the mounting surface to receive at least a portion of the deflected light for emission.

19. The LED light of claim 14, wherein the circuit board defines a plane conceptually dividing the housing into a first portion and a second portion, with the first portion defining the first lens surface and the second portion defining the second lens surface.

20. The LED light of claim 14, wherein the circuit board laterally spans the housing, dividing the housing into a first circumferential portion and a second circumferential portion, with the first circumferential portion defining the first lens surface and the second circumferential portion defining the second lens surface.

21. The LED light of claim 20, wherein the first circumferential portion and the second circumferential portion approximately comprise respective halves of the circumference of the housing.

* * * * *